United States Patent
Gupta et al.

(10) Patent No.: US 10,110,334 B2
(45) Date of Patent: Oct. 23, 2018

(54) HIGH SPEED SERIALIZER USING QUADRATURE CLOCKS

(71) Applicant: APPLIED MICRO CIRCUITS CORPORATION, Santa Clara, CA (US)

(72) Inventors: Vijay Gupta, Bangalore (IN); Tarun Gupta, Santa Clara, CA (US)

(73) Assignee: MACOM CONNECTIVITY SOLUTIONS, LLC, Lowell, MA (US)

(*) Notice: Subject to any disclaimer, the term of this patent is extended or adjusted under 35 U.S.C. 154(b) by 360 days.

(21) Appl. No.: 15/137,187

(22) Filed: Apr. 25, 2016

(65) Prior Publication Data

US 2017/0310412 A1    Oct. 26, 2017

(51) Int. Cl.
| | |
|---|---|
| H04J 3/06 | (2006.01) |
| H04L 7/00 | (2006.01) |
| H03M 9/00 | (2006.01) |
| H04J 3/04 | (2006.01) |

(52) U.S. Cl.
CPC ............ *H04J 3/0691* (2013.01); *H03M 9/00* (2013.01); *H04J 3/0682* (2013.01); *H04L 7/0037* (2013.01); *H04J 3/047* (2013.01); *H04J 3/0685* (2013.01)

(58) Field of Classification Search
CPC ........ H04J 3/0682; H04J 3/0691; H04J 3/047; H04J 3/0685; H03M 9/00; H04L 7/0037
See application file for complete search history.

(56) References Cited

U.S. PATENT DOCUMENTS

| | | | |
|---|---|---|---|
| 7,006,021 B1* | 2/2006 | Lombaard | H03M 9/00 341/100 |
| 7,624,297 B2 | 11/2009 | Baumgartner et al. | |
| 7,945,805 B2 | 5/2011 | Baumgartner et al. | |
| 8,934,890 B2 | 1/2015 | Hu et al. | |

(Continued)

FOREIGN PATENT DOCUMENTS

KR    10-2008-0035325    4/2008

OTHER PUBLICATIONS

International Search Report & Written Opinion for PCT Application Serial No. PCT/US2017/029278, dated Jul. 27, 2017, 13 pages.

*Primary Examiner* — Oussama Roudani
(74) *Attorney, Agent, or Firm* — Amin, Turocy & Watson LLP

(57) ABSTRACT

Techniques efficiently serialize multiple data streams using quadrature clocks. Serializer employs first, second, third, and fourth clock signals. Serializer receives multiple data streams via registers, with each of four paths comprising a register, buffer, and switch, with registers of first and fourth paths associated with third clock signal, and registers of second and third paths associated with first clock signal, and with switches of first and fourth paths associated with first clock signal, and switches of second and third paths associated with third clock signal. Switches of first and second paths transfer respective data bits to fifth switch via another buffer, wherein fifth switch is associated with a delayed second clock signal of a time delay component (TDC). Switches of third and fourth paths transfer respective data bits to sixth switch via another buffer, wherein sixth switch is associated with a delayed fourth clock signal of TDC.

20 Claims, 13 Drawing Sheets

(56) References Cited

U.S. PATENT DOCUMENTS

| | | |
|---|---|---|
| 8,989,303 B2 | 3/2015 | Dally |
| 8,995,600 B1 | 3/2015 | Gopalakrishnan et al. |
| 9,077,391 B2 | 7/2015 | Negra et al. |
| 9,178,521 B2 | 11/2015 | Giaconi et al. |
| 9,178,563 B2 | 11/2015 | Ren et al. |
| 9,219,470 B1 | 12/2015 | Venditti |
| 2003/0063626 A1* | 4/2003 | Karlquist ............... H04J 3/047 370/503 |
| 2009/0153212 A1 | 6/2009 | Jeffries et al. |
| 2010/0183108 A1* | 7/2010 | Shin ................. H03M 9/00 375/356 |
| 2015/0222376 A1* | 8/2015 | Chieco ................ H03L 7/07 370/503 |
| 2016/0006596 A1* | 1/2016 | Dickson ............... H04L 27/364 375/298 |

* cited by examiner

HIGH SPEED SERIALIZER USING QUADRATURE CLOCKS

TECHNICAL FIELD

The subject disclosure relates generally to communication of information, e.g., to communicating information via high speed serialization using quadrature clocks.

BACKGROUND

A device, such as a transmitter or digital-to-analog converter (DAC), can be used to transmit data (e.g., voice data or other data) to another device (e.g., receiver). The voice data or other data can be communicated via a wireline or wireless communication connection. One trend is to increase the speed of communication of data.

To facilitate communicating data by a device (e.g., transmitter, DAC), the device can employ a serializer (e.g., a 2:1 serializer, 4:1 serializer, 8:1 serializer, . . . ) that can be used, for example, to receive and serialize multiple (e.g., 2, 4, 8, . . . ) parallel data streams to generate a single serial data stream comprising the data of the multiple data streams as an output. A serializer also can be referred to as a multiplexer.

The above-described description is merely intended to provide a contextual overview of current systems associated with devices that communicate information and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

The speed of conventional serializers can be negatively impacted or limited due to various issues, such as capacitance related to switching that can limit the maximum frequency at which the serializer can operate and/or inter symbol interference that can be due to charge sharing between different switches in the serializer. Also, some conventional serializers can be inefficient with regard to power consumption and/or can suffer from degraded signal integrity. In an effort to overcome these deficiencies, in an example embodiment, disclosed herein is a system that contains a serializer component that converts multiple data streams to a serialized data stream based at least in part on quadrature clock signals comprising a first clock signal, a second clock signal, a third clock signal, and a fourth clock signal, wherein the multiple data streams comprise a first data stream, a second data stream, a third data stream, and a fourth data stream. The system can also contain a time delay component that generates a first time-delayed clock signal based at least in part on the second clock signal, and generates a second time-delayed clock signal based at least in part on the fourth clock signal, wherein the time delay component provides the first time-delayed clock signal to a switch associated with the first data stream and the second data stream to facilitate control of switching of the switch, and provides the second time-delayed clock signal to another switch associated with the third data stream and the fourth data stream to facilitate control of switching of the other switch.

In another example embodiment, disclosed herein is a method that comprises converting multiple data streams to a serialized data stream based at least in part on quadrature clock signals comprising a first clock signal, a second clock signal, a third clock signal, and a fourth clock signal, wherein the multiple data streams comprise a first data stream, a second data stream, a third data stream, and a fourth data stream. The method also can involve generating a first matching delay clock signal based at least in part on the second clock signal, wherein the first matching delay clock signal is provided to a switch associated with the first data stream and the second data stream to facilitate controlling switching of the switch to facilitate the converting. The method also can involve generating a second matching delay clock signal based at least in part on the fourth clock signal, wherein the second matching delay clock signal is provided to another switch associated with the third data stream and the fourth data stream to facilitate the controlling of the switching of the other switch to facilitate the converting.

In yet another example embodiment, disclosed herein is a device that contains a serializer component that converts multiple data streams to a single serialized data stream based at least in part on quadrature clock signals comprising a first clock signal, a second clock signal, a third clock signal, and a fourth clock signal, wherein the multiple data streams comprise a first data stream, a second data stream, a third data stream, and a fourth data stream. The system also can contain a set of register components comprising a first register component, a second register component, a third register component, and a fourth register component, wherein the set of register components receive the multiple data streams, wherein the first register component transfers first data of the first data stream and the fourth register component transfers fourth data of the fourth data stream based at least in part on the third clock signal, and wherein the second register component transfers second data of the second data stream and the third register component transfers third data of the third data stream based at least in part on the first clock signal. The system further can contain a set of switch components comprising a first switch component, a second switch component, a third switch component, a fourth switch component, a fifth switch component, and a sixth switch component, wherein the first switch component transfers the first data and the fourth switch component transfers the fourth data based at least in part on the first clock signal, and wherein the second switch component transfers the second data and the third switch component transfers the third data based at least in part on the third clock signal. The system also can contain a time delay component that generates a first matching delay clock signal based at least in part on the second clock signal, and generates a second matching delay clock signal based at least in part on the fourth clock signal, wherein the time delay component provides the first matching delay clock signal to the fifth switch component associated with the first data stream and the second data stream to facilitate control of switching of the fifth switch component, and provides the second matching delay clock signal to a sixth switch component associated with the third data stream and the fourth data stream to facilitate control of switching of the sixth switch component.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents.

Other advantages and novel features will become apparent from the following detailed description when considered in conjunction with the drawings.

DETAILED DESCRIPTION

Figure 1:
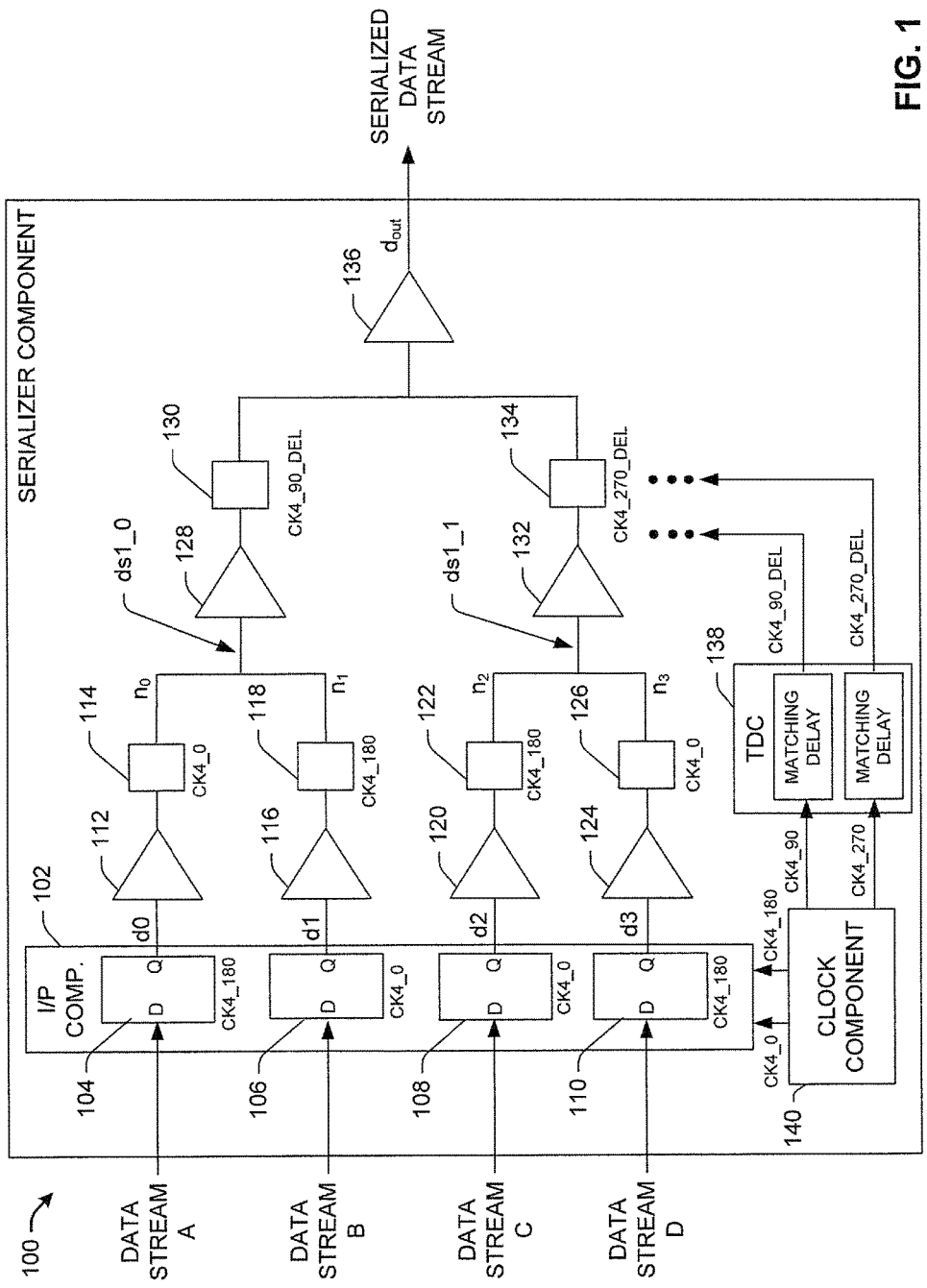
FIG. 1 illustrates a diagram of an example, non-limiting serializer component that can efficiently serialize multiple (e.g., multiple parallel) data streams using quadrature clocks, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

To facilitate communicating data by a device, such as a transmitter or a digital-to-analog converter (DAC), the device can employ a serializer (e.g., a 2:1 serializer, 4:1 serializer, 8:1 serializer, . . . ) that can be used, for example, to receive and serialize multiple (e.g., 2, 4, 8, . . . ) parallel data streams to convert the multiple parallel data streams to generate a single serial data stream comprising the data of the multiple data streams as an output. A serializer also can be referred to as a multiplexer (MUX) (e.g., a 2:1 MUX, 4:1 MUX, 8:1 MUX, . . . ). Various types of conventional serializers can employ quadrature clocks as part of their structure and operation.

However, conventional serializers can have a number of drawbacks. For instance, the speed of conventional serializers can be negatively impacted or limited due to various issues, such as capacitance related to switching that can limit the maximum frequency at which the serializer can operate and/or inter symbol interference (ISI) that can be due to charge sharing between different switches in the serializer. Also, some conventional serializers can be inefficient with regard to power consumption and/or can suffer from degraded signal integrity.

Figure 10:
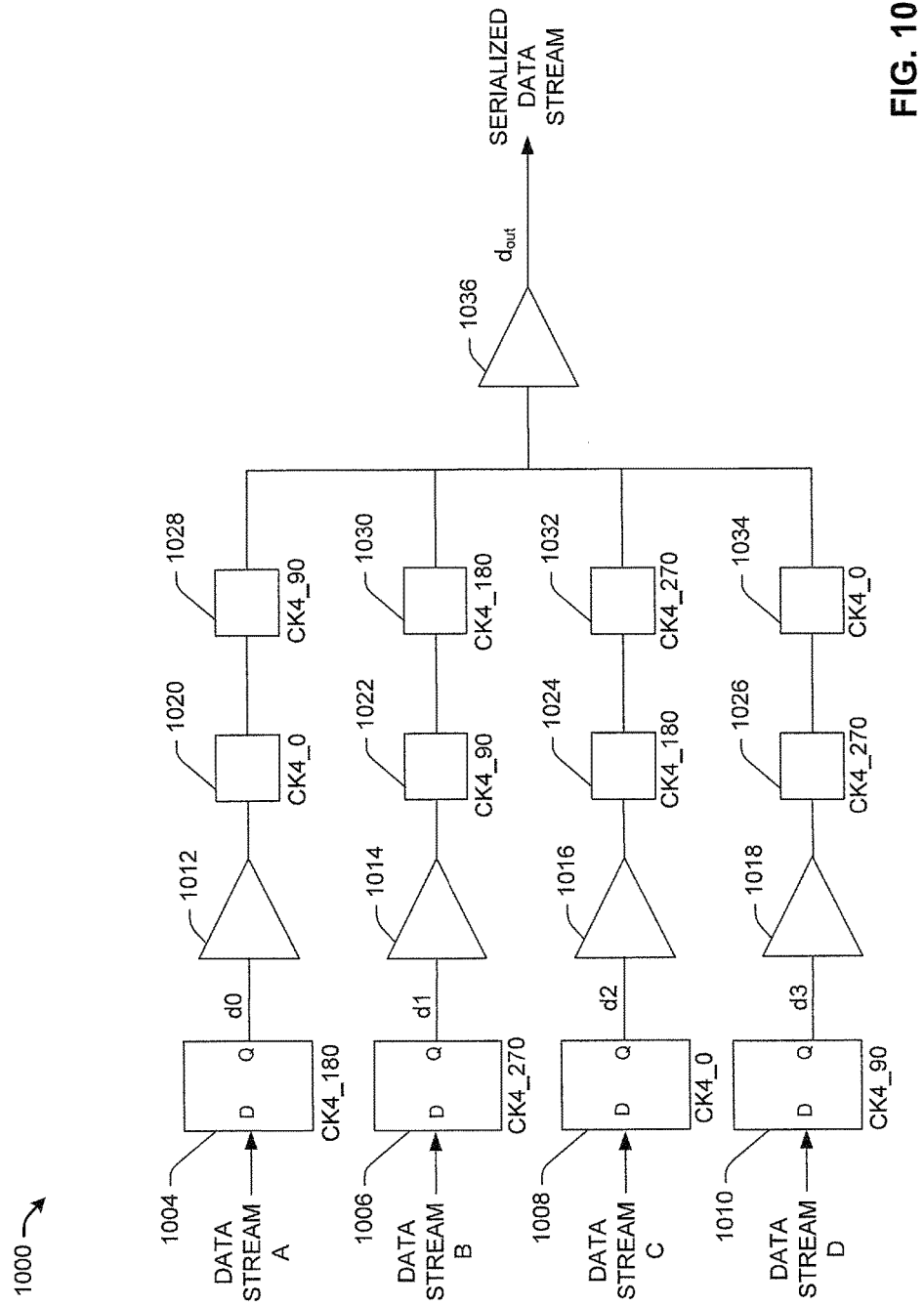
FIG. 10 illustrates a diagram comprising an example 4:1 serializer that uses quadrature clocks with multiple switches in series in each of the multiple data streams.
Figure 11:
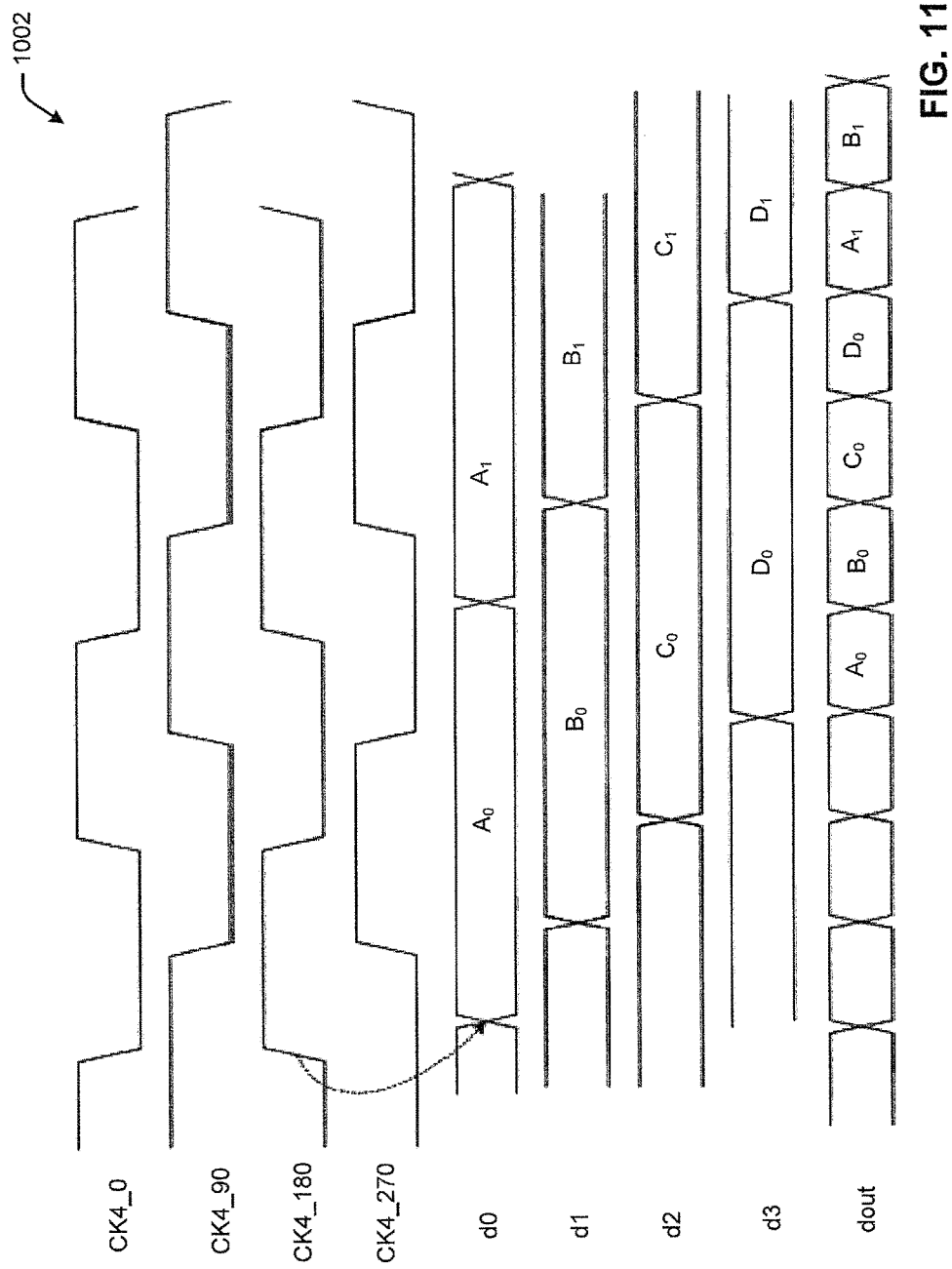
FIG. 11 presents an example timing diagram relating to the timing of clock signals and data transfers for the serializer of FIG. 10.

Referring briefly to FIGS. 10 and 11, FIG. 10 illustrates a diagram comprising an example 4:1 serializer 1000 that uses quadrature clocks with multiple switches in series in each of the multiple data streams. FIG. 11 presents an example timing diagram 1002 relating to the timing of clock signals and data transfers for the serializer 1000.

The serializer 1000 can receive respective data streams in parallel and can convert the parallel data streams to a single serial stream, which can be provided as an output $d_{out}$. The serializer 1000 can comprise registers 1004, 1006, 1008, and 1010 that can receive the respective data streams in parallel at their respective inputs (e.g., respective Ds). The registers 1004, 1006, 1008, and 1010 can be separately (e.g., differently) clocked (e.g., cycled) or operated using quadrature clocks that can provide respective clock signals (e.g., CK4_180, CK4_270, CK4_0, CK4_90) to the registers 1004, 1006, 1008, and 1010 to facilitate transferring respective data bits of the respective input data streams of the registers 1004, 1006, 1008, and 1010 to the respective outputs of the registers 1004, 1006, 1008, and 1010, as outputs $d_0$, $d_1$, $d_2$, and $d_3$, at respective times based at least in part on the respective clock signals of the clocks.

The output bits, $d_0$, $d_1$, $d_2$, and $d_3$ provided from the outputs (e.g., respective Qs) of the registers 1004, 1006, 1008, and 1010 can be fed (e.g., communicated) to respective buffers 1012, 1014, 1016, and 1018 that can be respectively associated with (e.g., communicatively connected to) the registers 1004, 1006, 1008, and 1010 in the respective signal paths. The buffers 1012, 1014, 1016, and 1018 can temporarily store their respective data bits, and can provide their respective data bits, $d_0$, $d_1$, $d_2$, and $d_3$, to respective inputs of a first set of switches, comprising switch 1020, switch 1022, switch 1024, and switch 1026, in the respective signal paths, in accordance with the respective clock signals associated with the registers 1004, 1006, 1008, and 1010.

Switch 1020 in the first signal path can be associated with clock signal CK4_0. Switch 1022 in the second signal path can be associated with clock signal CK4_90. Switch 1024 in the third signal path can be associated with clock signal CK4_180. Switch 1026 in the fourth signal path can be associated with clock signal CK4_270. The respective switches 1020, 1022, 1024, and 1026 in the first set of switches can provide (e.g., communicate) their respective data bits as outputs from the switches 1020, 1022, 1024, and 1026 at respective times, in accordance with their respective clock signals. At the respective times, the outputs from the switches 1020, 1022, 1024, and 1026 of the first set of switches can be provided to respective switches of a second set of switches, comprising switch 1028, switch 1030, switch 1032, and switch 1034, in the respective signal paths.

For each signal path, the switch from the first set of switches can be differently clocked than the associated switch from the second set of switches. For instance, switch 1028 in the first signal path can be associated with clock signal CK4_90, whereas switch 1020 can be associated with clock signal CK4_0; switch 1030 in the second signal path can be associated with clock signal CK4_180, whereas switch 1022 can be associated with clock signal CK4_90; switch 1032 in the third signal path can be associated with clock signal CK4_270, whereas switch 1024 can be associated with clock signal CK4_180; and switch 1034 in the fourth signal path can be associated with clock signal CK4_0, whereas switch 1026 can be associated with clock signal CK4_270. The use of multiple switches in each signal path can facilitate coordinating the respective data bits of the respective data streams to facilitate combining the respective data bits into a serialized data bit stream in a desired (e.g., proper) bit order, in accordance with the input bits of the parallel data streams.

The respective bits, $d_0$, $d_1$, $d_2$, and $d_3$, can be provided as an output from the respective switches 1028, 1030, 1032, and 1034 of the second set of switches to a single signal path at node Y, wherein the respective bits can be input to the input of buffer 1036 at respective times, in accordance with the respective clock signals associated with the respective switches 1028, 1030, 1032, and 1034 of the second set of switches. The respective bits input to the buffer 1036 can be the respective data bits of the four signal paths serialized into a single data bit stream. The buffer 1036 can provide the serialized data stream as an output, $d_{out}$, from the serializer 1000.

The timing diagram 1002 illustrates the respective signal timing of the respective clock signals, CK4_0, CK4_90, CK4_180, and CK4_270, the respective bits, $d_0$, $d_1$, $d_2$, $d_3$, output from the respective registers 1004, 1006, 1008, and 1010, and the serialized data stream, $d_{out}$, which can be provided as an output from the serializer 1000. The timing diagram 1002 shows the respective timing of the output, $d_0$, (e.g., $A_0$, $A_1$, . . . ) from the register 1004 in the first signal path in relation to the clock signal CK4_180 associated with the register 1004. The timing diagram 1002 also shows the respective timing of the output, $d_1$, (e.g., $B_0$, $B_1$, . . . ) from the register 1006 in the second signal path in relation to the clock signal CK4_270 associated with the register 1006. Correspondingly, the timing diagram 1002 shows the respective timing of the output, $d_2$, (e.g., $C_0$, $C_1$, . . . ) from the register 1008 in the third signal path in relation to the clock signal CK4_0 associated with the register 1008, and the respective timing of the output, $d_3$, (e.g., $D_0$, $D_1$, . . . ) from the register 1010 in the fourth signal path in relation to the clock signal CK4_90 associated with the register 1010.

The timing diagram 1002 also illustrates the timing and serialization of the serialized data stream provided as output $d_{out}$ from the serializer 1000 in relation to the timing of the respective bits, $d_0$, $d_1$, $d_2$, and $d_3$, output from the respective registers 1004, 1006, 1008, and 1010 and in relation to the respective clock signals, CK4_0, CK4_90, CK4_180, and CK4_270. As can be seen from the timing diagram 1002, the serialized data stream, $d_{out}$, can comprise respective data bits of the respective parallel data streams in a single serialized data stream in a desired (e.g., proper) order (e.g., $A_0$, $B_0$, $C_0$, $D_0$, $A_1$, $B_1$, $C_1$, $D_1$, . . . ) based at least in part on the respective cycling of the clock signals associated with the respective registers 1004, 1006, 1008, and 1010.

While the serializer 1000 can convert four parallel data streams to a single serialized data stream, this serializer 1000 can suffer from a number of operational inefficiencies and/or issues, which can make its use in data communications undesirable. For instance, the speed of the serializer 1000 can be undesirably slow and limited. The waveform at node Y can be undesirably slow due at least in part to the multiple switching in the signal paths, which can reduce driving strength of the signals and can increase capacitance. This can limit the maximum frequency at which the serializer 1000 can operate, which can limit the speed of the serializer 1000 to an undesirably slow speed. Further, the serializer 1000 can suffer from ISI due at least in part to charge sharing between the different switches of the serializer 1000.

Figure 12:
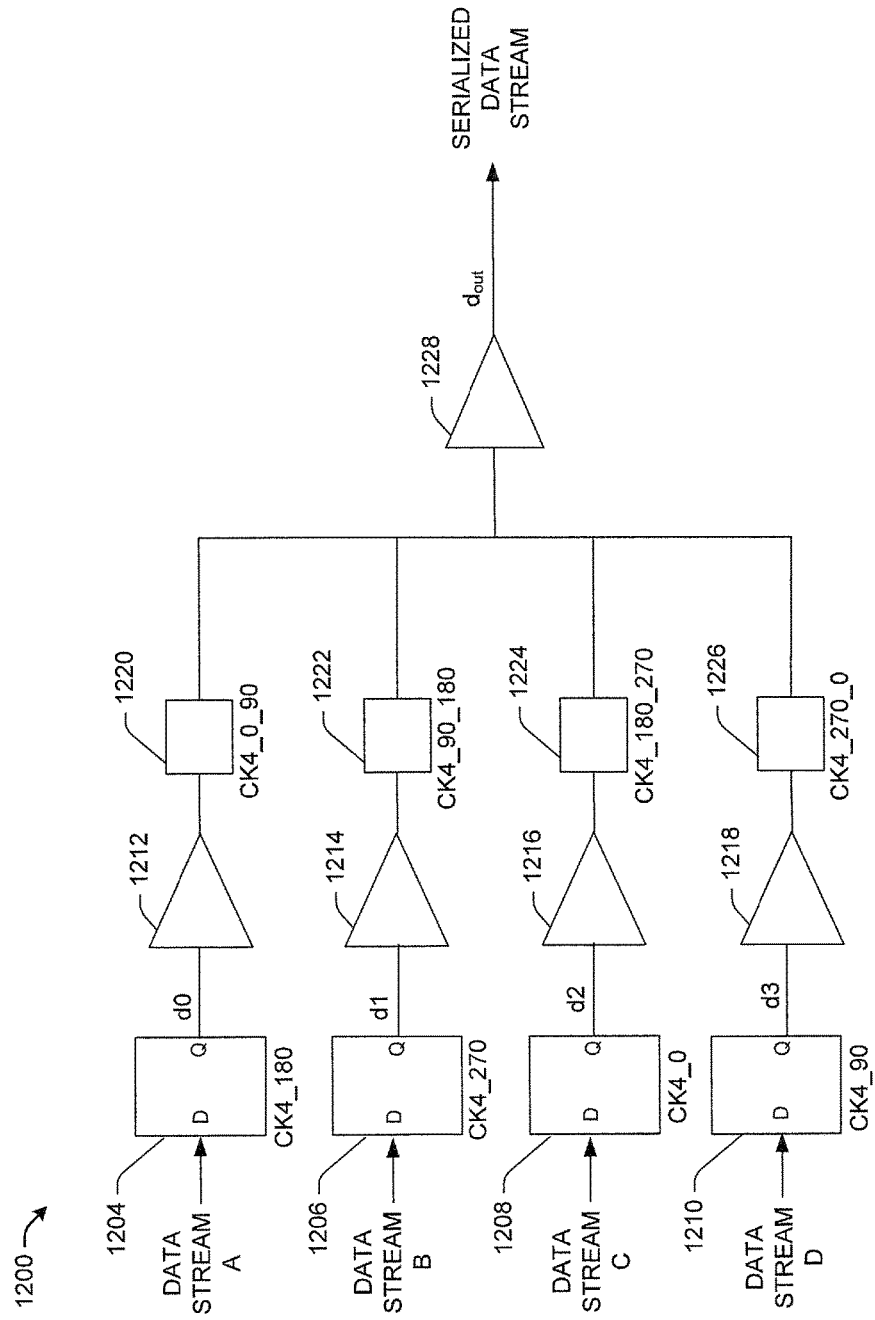
FIG. 12 depicts a diagram comprising another example 4:1 serializer that uses quadrature clocks with a switch in each of the multiple data streams, wherein multiple clocks are combined before each switch.
Figure 13:
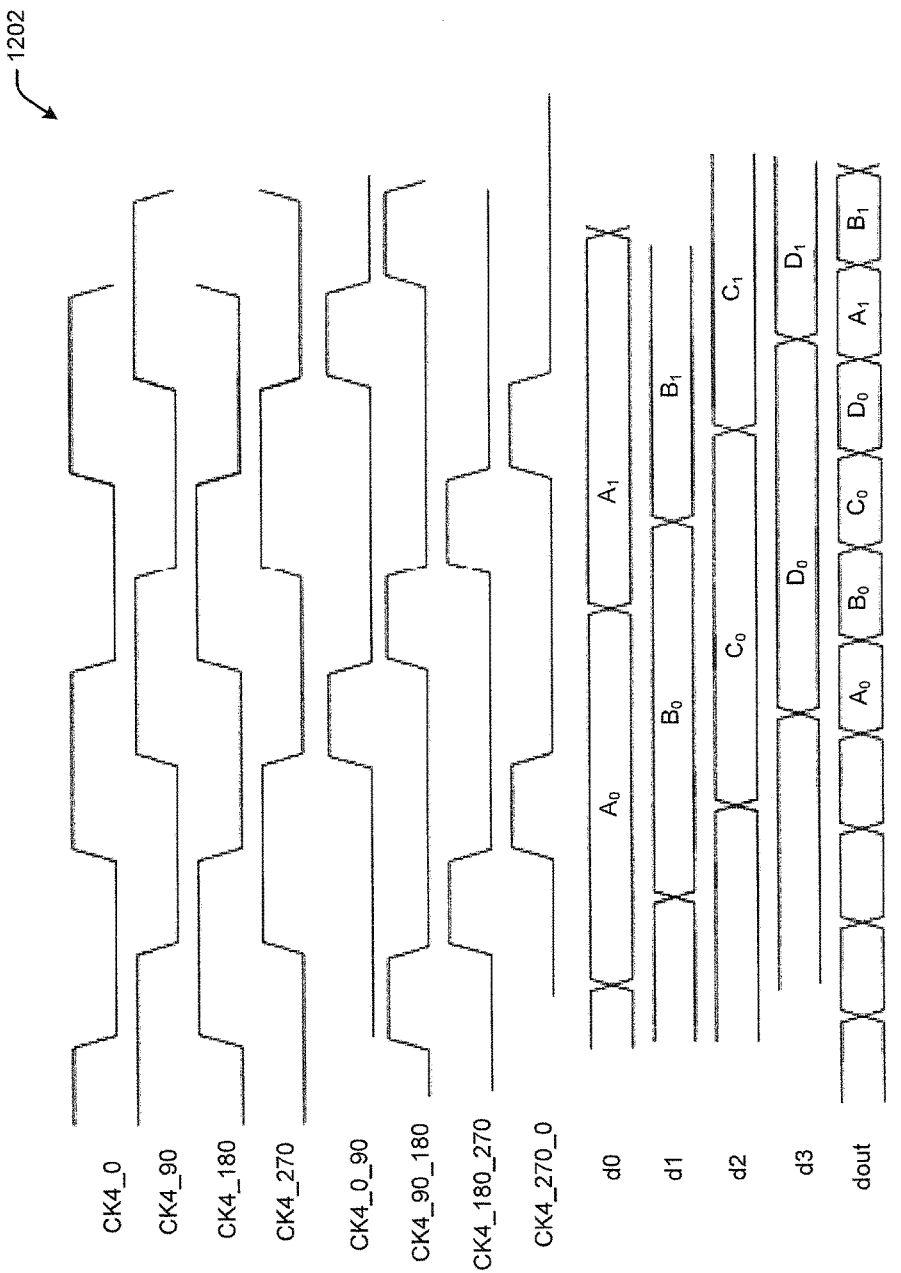
FIG. 13 presents an example timing diagram relating to the timing of clock signals and data transfers for the serializer of FIG. 12.

Turning briefly to FIGS. 12 and 13, FIG. 12 depicts a diagram comprising another example 4:1 serializer 1200 that uses quadrature clocks with a switch in each of the multiple data streams, wherein multiple clocks are combined before each switch. FIG. 13 presents an example timing diagram 1202 relating to the timing of clock signals and data transfers for the serializer 1200.

The serializer 1200 can receive respective data streams in parallel and can convert the parallel data streams to a single serial stream, which can be provided as an output $d_{out}$. The serializer 1200 can comprise registers 1204, 1206, 1208, and 1210 that can receive the respective data streams in parallel at their respective inputs (e.g., respective Ds). The registers 1204, 1206, 1208, and 1210 can be separately (e.g., differently) clocked (e.g., cycled) or operated using quadrature clocks that can provide respective clock signals (e.g., CK4_180, CK4_270, CK4_0, CK4_90) to the registers 1204, 1206, 1208, and 1210 to facilitate transferring respective data bits of the respective input data streams of the registers 1204, 1206, 1208, and 1210 to the respective outputs (e.g., respective Qs) of the registers 1204, 1206, 1208, and 1210, as outputs $d_0$, $d_1$, $d_2$, and $d_3$, at respective times based at least in part on the respective clock signals of the clocks.

The output bits, $d_0$, $d_1$, $d_2$, and $d_3$ provided from the outputs of the registers 1204, 1206, 1208, and 1210 can be provided (e.g., communicated) to respective buffers 1212, 1214, 1216, and 1218 that can be respectively associated with the registers 1204, 1206, 1208, and 1210 in the respective signal paths. The buffers 1212, 1214, 1216, and 1218 can temporarily store their respective data bits, and can provide their respective data bits, $d_0$, $d_1$, $d_2$, and $d_3$, to respective inputs of a set of switches, comprising switch 1220, switch 1222, switch 1224, and switch 1226, in the respective signal paths, in accordance with the respective clock signals associated with the registers 1204, 1206, 1208, and 1210.

With regard to each switch, the serializer 1200 can be structured to combine two respective clock signals before the switch. For instance, switch 1220 in the first signal path can be associated with clock signal CK4_0_90, which can be the combination of clock signals CK4_0 and CK4_90. Switch 1222 in the second signal path can be associated with clock signal CK4_90_180, which can be the combination of clock signals CK4_90 and CK4_180. Switch 1224 in the third signal path can be associated with clock signal CK4_180_270, which can be the combination of clock signals CK4_180 and CK4_270. Switch 1226 in the fourth signal path can be associated with clock signal CK4_270_0, which can be the combination of clock signals CK4_270 and CK4_0. The use of respective combined clock signals with the respective switches 1220, 1222, 1224, and 1226, in the respective signal paths can facilitate coordinating the respective data bits of the respective data streams to facilitate combining the respective data bits into a serialized data bit stream in a desired (e.g., proper) bit order, in accordance with the input bits associated with the parallel data streams.

In accordance with the respective combined clock signals, the respective data bits, $d_0$, $d_1$, $d_2$, and $d_3$, can be provided (e.g., communicated) as an output from the respective switches 1220, 1222, 1224, and 1226 to a single signal path at node Y, wherein the respective data bits can be input to the input of buffer 1228 at respective times, in accordance with the respective combined clock signals associated with the respective switches 1220, 1222, 1224, and 1226. The respective bits input to the buffer 1228 can be the respective data bits of the four signal paths serialized into a single data bit stream. The buffer 1228 can provide the serialized data stream as an output, $d_{out}$, from the serializer 1200.

The timing diagram 1202 illustrates the respective signal timing of the respective clock signals, CK4_0, CK4_90, CK4_180, and CK4_270, the respective combined clock signals, CK4_0_90, CK4_90_180, CK4_180_270, and CK4_270_0, the respective bits, $d_0$, $d_1$, $d_2$, and $d_3$, output from the respective registers 1204, 1206, 1208, and 1210, and the serialized data stream, $d_{out}$, which can be provided as an output from the serializer 1200. The timing diagram 1202 shows the respective timing of the output, $d_0$, (e.g., $A_0$, $A_1$, . . . ) from the register 1204 in the first signal path in relation to the clock signal CK4_180 associated with the register 1204. Correspondingly, the timing diagram 1202 also shows the respective timing of the output, $d_1$, (e.g., $B_0$, $B_1$, . . . ) from the register 1206 in the second signal path in relation to the clock signal CK4_270 associated with the register 1206. The timing diagram 1002 also illustrates the respective timing of the output, $d_2$, (e.g., $C_0$, $C_1$, . . . ) from the register 1208 in the third signal path in relation to the clock signal CK4_0 associated with the register 1208, and the respective timing of the output, $d_3$, (e.g., $D_0$, $D_1$, . . . ) from the register 1210 in the fourth signal path in relation to the clock signal CK4_90 associated with the register 1210.

The timing diagram 1202 also illustrates the timing and serialization of the serialized data stream provided as output $d_{out}$ from the serializer 1200 in relation to the timing of the respective bits, $d_0$, $d_1$, $d_2$, and $d_3$, output from the respective registers 1204, 1206, 1208, and 1210, in relation to respective clock signals, CK4_0, CK4_90, CK4_180, and CK4_270, associated with the respective registers, and in relation to the respective combined clock signals, CK4_0_90, CK4_90_180, CK4_180_270, and CK4_270_0, associated with the respective switches 1220, 1222, 1224, and 1226. As can be seen from the timing diagram 1202, the serialized data stream, $d_{out}$ can comprise respective data bits of the respective parallel data streams in a single serialized data stream in a desired (e.g., proper) order (e.g., $A_0$, $B_0$, $C_0$, $D_0$, $A_1$, $B_1$, $C_1$, $D_1$, . . . ) based at least in part on the respective cycling of the clock signals associated with the respective registers 1204, 1206, 1208, and 1210, and the respective cycling of the combined clock signals associated with the respective switches 1220, 1222, 1224, and 1226.

While the serializer 1200 can convert four parallel data streams to a single serialized data stream, this serializer 1200 can suffer from a number of operational inefficiencies and/or issues, which can make its use in data communications undesirable. For instance, the speed of the serializer 1200 can be undesirably slow and limited. The waveform at node Y can be undesirably slow due at least in part to increased capacitance, and this can limit the maximum frequency at which the serializer 1200 can operate. Further, the structure of the serializer 1200 in combining two high speed clocks to generate 25% duty cycle clocks can consume an undesirable amount of power and can degrade signal integrity, which can make it relatively difficult to route the 25% duty cycle clocks.

To overcome the various inefficiencies of conventional serializer devices, techniques for efficiently serializing multiple (e.g., multiple parallel) data streams using quadrature clocks are presented. A serializer component can employ, for example, first, second, third, and fourth clock signals that can be applied to respective components of the serializer component to facilitate transferring data bits of multiple data streams (e.g., four parallel data streams) and converting the multiple data streams to a single serialized data stream. The serializer component can comprise registers, buffers, switches, and a time delay component, and can receive the multiple data streams via the registers, with each of four data paths comprising a register, a buffer, and a switch. The registers of the first and fourth data paths can be associated with the third clock signal, and the registers of the second and third paths can be associated with the first clock signal. The switches of the first and fourth paths can be associated with the first clock signal, and the switches of the second and third paths can be associated with the third clock signal. The switches of the first and second data paths can transfer respective data bits to a fifth switch via a buffer, wherein the fifth switch can be associated with a first matching time-delayed clock signal provided by the time delay component, wherein the time delay component can generate the first matching time-delayed clock signal (e.g., a time-delayed second clock signal) based at least in part on the second clock signal. The switches of the third and fourth data paths can transfer respective data bits to a sixth switch via another buffer, wherein the sixth switch can be associated with a second matching time-delayed clock signal provided by the time delay component, wherein the time delay component can generate the second matching time-delayed clock signal (e.g., a time-delayed fourth clock signal) based at least in part on the fourth clock signal. The fifth switch and sixth switch can provide (e.g., communicate, transfer) the respective data bits to an input port of an output buffer of the serializer component, in accordance with the first time-delayed clock signal and second time-delayed clock signal, respectively. The output buffer can provide the data bits as a serialized singled data stream comprising the data of the multiple data streams in a serialized form.

These and other aspects and implementations of the disclosed subject matter will now be described in connection with the figures.

FIG. 1 illustrates a diagram of an example, non-limiting serializer component 100 that can efficiently serialize multiple (e.g., multiple parallel) data streams using quadrature clocks, in accordance with various aspects and embodiments of the disclosed subject matter. The serializer component 100 can be or can be part of a multiplexer, for example. In accordance with various implementations, the serializer component can be part of or associated with a device that can utilize the serializer component to convert multiple data streams to a single serialized data stream. Such device can be or can comprise, for example, a transceiver (e.g., an electrical transceiver, an optical transceiver, a wireless transceiver, a backplane transceiver, a chip-to-chip transceiver, or other type of transceiver), a transmitter, a digital-to-analog (DAC) converter or other type of device that communicates and/or converts data. A transceiver can be, or can be part of, for example, a modem or router (e.g., a 10G modem or router (e.g., a 10G-baseT modem or router), a 40G modem or router (e.g., a 40G-baseT modem or router), a 1000 modem or router (e.g., a 100G-baseT modem or router), or a modem or router that can employ another (e.g., a faster or different) communication rate), a switch that can facilitate communication of traffic, a communication device that can employ optical communications technology and/or wireless communications technology, or another type of communication device.

In some implementations, the serializer component 100 can be a 4-to-1 (4:1) serializer component that can receive four data streams in parallel and can convert the four data streams to a single serialized data stream, for example, as depicted in FIG. 1. It is to be appreciated and understood that, although the disclosed subject matter describes a 4:1 serializer component, the disclosed subject matter is not limited to being employed as a 4:1 serializer component, as the techniques and aspects of the disclosed subject matter can be applied or extended (e.g., in a modified form) to configure a serializer component to be an x-to-y serializer component, wherein the serializer component can receive x data streams in parallel and can convert the x data streams to y data streams that can be output from the serializer component, wherein x can be a desired number greater than 1, and wherein y can be a desired number that is 1 or more, but less than x. As some non-limiting examples, the techniques and aspects of the disclosed subject matter can be applied or extended (e.g., in a modified form) to configure a serializer component as an 8-to-1 serializer component, a 16-to-1 serializer component, an 8-to-2 serializer component, a 16-to-2 serializer component, or a 5-to-1 serializer component.

The serializer component 100 can comprise a set of data paths on which data (e.g., voice or data traffic) can be communicated, wherein the set of data paths can include a first data path, second data path, third data path, and fourth data path. The serializer component 100 also can comprise an input component (I/P comp.) 102 (e.g., a register component), which can include a set of input sub-components (e.g., registers), comprising, for example, a first input sub-component 104, a second input sub-component 106, a third input sub-component 108, and a fourth input sub-component 110, wherein respective input sub-components (e.g., 104, 106, 108, 110) can be associated with (e.g., part of) respective data paths.

With regard to the first data path, an output (e.g., output port) of the first input sub-component 104 can be associated with (e.g., communicatively connected to) an input (e.g., input port) of a first buffer 112. The output of the first buffer 112 can be associated with an input of a first switch 114 in the first data path.

Regarding the second data path, an output of a second input sub-component 106 can be associated with an input of a second buffer 116. The output of the second buffer 116 can be associated with an input of a second switch 118 in the second data path.

With regard to the third data path, an output of a third input sub-component 108 can be associated with an input of a third buffer 120. The output of the third buffer 120 can be associated with an input of a third switch 122 in the third data path.

With regard to the fourth data path, an output of a fourth input sub-component 110 can be associated with an input of a fourth buffer 124. The output of the fourth buffer 124 can be associated with an input of a fourth switch 126 in the fourth data path.

Referring back to the first and second data paths, at the output of the first switch 114 in the first data path and at the output of the second switch 116 in the second data path, the first data path and the second data path can be connected together to form a single data path that can be associated with (e.g., communicatively connected to) an input of a fifth buffer 128. For instance, a first node (e.g., node $n_0$) in the first data path and a second node (e.g., node $n_1$) in the second data path can be shorted to form a single data path that can be associated with the input of the fifth buffer 128. The output of the fifth buffer 128 can be connected to an input of a fifth switch 130 in that single data path.

At the output of the third switch 120 in the third data path and at the output of the fourth switch 124 in the fourth data path, the third data path and the fourth data path can be connected together to form another single data path that can be associated with an input of a sixth buffer 132. For instance, a third node (e.g., node $n_2$) in the third data path and a fourth node (e.g., node $n_3$) in the fourth data path can be shorted to form the other single data path that can be associated with the input of the sixth buffer 132. The output of the sixth buffer 132 can be connected to an input of a sixth switch 134 in that other single data path. In some implementations, the switches (e.g., 114, 118, 122, 126, 130, and/or 134) can be complementary metal-oxide-semiconductor (CMOS) switches. In other implementations, another type(s) of switch can be employed in the serializer component.

With further regard to the single data path and the other single data path, at the output of the fifth switch 130 and the output of the sixth switch 134, the single data path and the other single data path can be connected together to form a data path (e.g., output data path) that can be associated with a seventh buffer 136 (e.g., output buffer) at the output of the serializer component 100. The seventh buffer 136 can provide the serialized data stream as an output (e.g., $d_{out}$) from the serializer component 100.

In some implementations, the serializer component 100 can comprise a time delay component 138 (TDC 138) that can be associated with the fifth switch 130 and the sixth switch 134 to facilitate implementing time-delayed clock signals (e.g., matching time-delayed clock signals) that can be applied to the clock inputs (e.g., clock input ports) of the fifth switch 130 and sixth switch 134 to facilitate controlling the timing of the outputting or transferring of the respective data bits from the fifth switch 130 and from the sixth switch 134, as more fully disclosed herein.

The serializer component 100 also can be associated with or can comprise a clock component 140 that can generate the clock signals that can be provided to (e.g., applied to) the clock inputs of the various components (e.g., input sub-components, switches, time delay component) of the serializer component 100. For example, the clock component 140 can employ a set of quadrature clocks that can provide a first clock signal (CK4_0), a second clock signal (CK4_90), a third clock signal (CK4_180), and a fourth clock signal (CK4_270) to respective components of the serializer component 100, as more fully described herein. The clock component 140 can generate the clock signals at a desired speed, such as, for example, 5 gigahertz (GHz), 2.4 GHz, or other desired clock speed that is higher or lower than 5 GHz.

The first input sub-component 104, second input sub-component 106, third input sub-component 108, and fourth input sub-component 110 can be separately (e.g., respectively) clocked (e.g., cycled) or operated using desired clock signals produced by the clock component 140. In some implementations, the clock component 140 can provide (e.g., apply) the first clock signal (e.g., CK4_0) to the clock input of the second input sub-component 106 and the clock input of the third input sub-component 108. The clock component 140 also can provide the third clock signal (e.g., CK4_180) to the clock input of the first input sub-component 104 and the clock input of the fourth input sub-component 110.

The first switch 114, second switch 118, third switch 122, and fourth switch 126 also can be separately (e.g., respectively) clocked (e.g., cycled) or operated using desired clock signals produced by the clock component 140. In some implementations, the clock component 140 can provide (e.g., apply) the first clock signal (e.g., CK4_0) to the clock input of the first switch 114 and the clock input of the fourth switch 126. The clock component 140 also can provide the third clock signal (e.g., CK4_180) to the clock input of the second switch 118 and the clock input of the third switch 122. It can be observed that, for each data path, the clock signal applied to the input sub-component can be different from the clock signal applied to the switch (e.g., can be a half time cycle away from the clock signal applied to the switch), wherein, for example, with regard to the use of quadrature clocks, in the first data path, the first clock signal can be a half time cycle away from the third clock signal.

In certain implementations, the clock component 140 can provide the second clock signal (e.g., CK4_90) and the fourth clock signal (e.g., CK4_270) to the time delay component 138 to facilitate enabling the time delay component 138 to generate respective matching time-delayed clock signals (e.g., CK4_90_DEL, CK4_270_DEL) based at least in part on the second clock signal and fourth clock signal, respectively. With regard to the use of quadrature clocks, the second clock signal can be a half time cycle away from the fourth clock signal, and can be a quarter time cycle away from each of the first clock signal and third clock signal.

As disclosed, the time delay component 138 can provide the first time-delayed clock signal (e.g., CK4_90_DEL) (also referred to herein as the first matching delay signal or first matching time-delayed clock signal) to the clock input of the fifth switch 130 and the second time-delayed clock signal (e.g., CK4_270_DEL) (also referred to herein as the second matching delay signal or second matching time-delayed clock signal) to the clock input of the sixth switch 134. The first time-delayed clock signal (e.g., CK4_90_DEL) can be delayed by a defined length of time from the second clock signal upon which the first time-delayed clock signal is based, and the second time-delayed clock signal (e.g., CK4_270_DEL) can be delayed by a defined length of time from the fourth clock signal upon which the second time-delayed clock signal is based.

With further regard to the structure and operation of the serializer component 100, the serializer component 100 can receive respective data streams of data (e.g., data stream A, data stream B, data stream C, data stream D), for example, in parallel, and can convert the parallel data streams to generate a single serial data stream, which can be provided as an output $d_{out}$ from the output buffer. For instance, the first input sub-component 104 can receive the first data stream (e.g., data stream A) via its input port, the second input sub-component 106 can receive the second data stream (e.g., data stream B) via its input port, the third input sub-component 108 can receive the third data stream (e.g., data stream C) via its input port, and the fourth input sub-component 110 can receive the fourth data stream (e.g., data stream D) via its input port. The respective data streams can be received by the respective input sub-components (e.g., 104, 106, 108, 110) simultaneously (e.g., in parallel). The first data stream (e.g., data stream A) can comprise a first set of data bits (e.g., data bit $A_0$, data bit $A_1$, data bit $A_2$, . . . ), the second data stream (e.g., data stream B) can comprise a second set of data bits (e.g., data bit $B_0$, data bit $B_1$, data bit $B_2$, . . . ), the third data stream (e.g., data stream C) can comprise a first set of data bits (e.g., data bit $C_0$, data bit $C_1$, data bit $C_2$, . . . ), and the fourth data stream (e.g., data stream D) can comprise a fourth set of data bits (e.g., data bit $D_0$, data bit $D_1$, data bit $D_2$, . . . ).

The input sub-components (e.g., 104, 106, 108, 110) can be separately (e.g., respectively) clocked (e.g., cycled) or operated using the respective clock signals (e.g., CK4_180, CK4_0) applied to the input sub-components to facilitate transferring respective data bits of the respective input data streams of the input sub-components from the respective outputs (e.g., output ports) of the input sub-components, as outputs $d_0$, $d_1$, $d_2$, and $d_3$, at respective times based at least in part on the respective clock signals of the clocks that are applied to the input sub-components (e.g., at respective times when the respective clock signals are at a high level or at a binary value of 1).

For example, with regard to data bits of the first data stream, during a clock cycle of the third clock signal, the first input sub-component 104 can transfer a data bit of the first data stream as an output from the output port of the first input sub-component 104 based at least in part on the third clock signal provided to the first input sub-component 104 (e.g., during the portion of the clock cycle when the third clock signal is or transitions to a high level or binary 1 value). For data bits of the second data stream, during a clock cycle of the first clock signal, the second input sub-component 106 can transfer a data bit of the second data stream as an output from the output port of the second input sub-component 106 based at least in part on the first clock signal provided to the second input sub-component 106 (e.g., during the portion of the clock cycle when the first clock signal is at or transitions to a high level or binary 1 value). With regard to data bits of the third data stream, during a clock cycle of the first clock signal, the third input sub-component 108 can transfer a data bit of the third data stream as an output from the output port of the third input sub-component 108 based at least in part on the third clock signal provided to the third input sub-component 108. Regarding data bits of the fourth data stream, during a clock cycle of the third clock signal, the fourth input sub-component 110 can transfer a data bit of the fourth data stream as an output from the output port of the fourth input sub-component 110 based at least in part on the first clock signal provided to the fourth input sub-component 110.

The output data bits, $d_0$, $d_1$, $d_2$, and $d_3$ provided from the outputs (e.g., respective Qs) of the input sub-components 104, 106, 108, and 110 can be fed (e.g., communicated, transferred) to respective buffers, e.g., the first buffer 112, the second buffer 116, the third buffer 120, and the fourth buffer 124, that can be associated with (e.g., communicatively connected to) the input sub-components 104, 106, 108, and 110 in the respective data paths (e.g., signal paths). The buffers 112, 116, 120, and 124 can temporarily store or maintain the respective data bits they receive, and can provide their respective data bits, $d_0$, $d_1$, $d_2$, and $d_3$, to respective inputs of a first set of switches, which can comprise the first switch 114, second switch 118, third switch 122, and fourth switch 126, in the respective data paths, in accordance with the respective clock signals associated with the input sub-components 104, 106, 108, and 110.

The respective switches, first switch 114, second switch 118, third switch 122, and fourth switch 126, can receive the respective data bits, $d_0$, $d_1$, $d_2$, and $d_3$, from the respective buffers 112, 116, 120, and 124. The first switch 114 in the first data path can transfer data bit, $d_0$, that is, the data bit (e.g., data bit $A_0$, data bit $A_1$, data bit $A_2$, . . . ) being transferred at the time, to the input of the fifth buffer 128, via a data path that is used to communicate data ds1_0 and is associated with the shorted nodes $n_0$ and $n_1$, based at least in part on the first clock signal, CK4_0, (e.g., during the portion of the clock cycle when the first clock signal is at or transitions to a high level or binary 1 value), wherein the data data ds1_0 can be the data bits being communicated at respective times via the first data path or second data path. The second switch 118 in the second data path can transfer data bit, $d_1$, that is, the data bit (e.g., data bit $B_0$, data bit $B_1$, data bit $B_2$, . . . ) being transferred at the time, to the input of the fifth buffer 128, via the data path used to communicate the data ds1_0, based at least in part on the third clock signal, CK4_180, (e.g., during the portion of the clock cycle when the third clock signal is at or transitions to a high level or binary 1 value). The third switch 122 in the third data path can transfer data bit, $d_2$, that is, the data bit (e.g., data bit $C_0$, data bit $C_1$, data bit $C_2$, . . . ) being transferred at the time, to the input of the sixth buffer 132, via another data path that is used to communicate data ds1_1 and is associated with the shorted nodes $n_2$ and $n_3$, based at least in part on the third clock signal, CK4_180, (e.g., during the portion of the clock cycle when the third clock signal is at or transitions to a high level or binary 1 value), wherein the data ds1_1 can be the data bits being communicated at respective times via the third data path or fourth data path. The fourth switch 126 in the fourth data path can transfer data bit, $d_3$, that is, the data bit (e.g., data bit $D_0$, data bit $D_1$, data bit $D_2$, . . . ) being transferred at the time, to the input of the sixth buffer 132, via the other data path that is used to communicate data ds1_1, based at least in part on the first clock signal, CK4_0, (e.g., during the portion of the clock cycle when the first clock signal is at or transitions to a high level or binary 1 value).

At respective times, the fifth buffer 128 can temporarily store or maintain the data bits (e.g., data bit $d_0$ received from first switch 114, or data bit $d_1$ received from second switch 118) it receives. At respective times, the fifth buffer 128 can provide the data bit, $d_0$ or $d_1$, it is storing to the input of the fifth switch 130, which can be associated with (e.g., communicatively connected to) the first data path and the second data path via the data path associated with the data ds1_0. At respective times, the sixth buffer 132 can temporarily store or maintain the data bits (e.g., data bit $d_2$ received from third switch 122, or data bit $d_3$ received from fourth switch 126) it receives. At respective times, the sixth buffer 132 can provide the data bit, $d_2$ or $d_3$, it is storing to the input of the sixth switch 134, which can be associated with the third data path and the fourth data path via the other data path associated with the data ds1_1.

At respective times, the fifth switch 130 can receive the respective data bits, $d_0$ or $d_1$, from the fifth buffer 128. The fifth switch 130 can transfer data bit, do or $d_1$, that is, the data bit (e.g., data bit $A_0$, data bit $A_1$, data bit $A_2$, . . . , or data bit $B_0$, data bit $B_1$, data bit $B_2$, . . . ) being transferred at the time, to the input of the buffer 136 (e.g., output buffer) based at least in part on the first time-delayed clock signal, CK4_90_DEL, (e.g., during the portion of the clock cycle when the first time-delayed clock signal is at or transitions to a high level or binary 1 value).

At respective times, the sixth switch 134 can receive the respective data bits, $d_0$ or $d_1$, from the sixth buffer 132. The sixth switch 134 can transfer data bit, $d_2$ or $d_3$, that is, the data bit (e.g., data bit $C_0$, data bit $C_1$, data bit $C_2$, . . . , or data bit $D_0$, data bit $D_1$, data bit $D_2$, . . . ) being transferred at the time, to the input of the buffer 136 based at least in part on the second time-delayed clock signal, CK4_270_DEL, (e.g., during the portion of the clock cycle when the second time-delayed clock signal is at or transitions to a high level or binary 1 value).

The buffer 136 (e.g., the output buffer) can provide the serialized data stream (e.g., data bit $A_0$, data bit $B_0$, data bit $C_0$, data bit $D_0$, data bit $A_1$, data bit $B_1$, data bit $C_1$, data bit $D_1$, data bit $A_2$, data bit $B_2$, data bit $C_2$, data bit $D_2$, . . . ) as an output, for example, to another device or component associated with (e.g., communicatively connected to) the serializer component 100.

Employing the techniques and aspects of the disclosed subject matter, the serializer component 100 can provide improved speed (e.g., faster speed) and/or an improved architecture (e.g., a less complex architecture), as compared to conventional serializers. Also, the serializer component 100 can improve (e.g., mitigate or reduce) charge sharing issues, as compared to conventional serializers.

Figure 2:
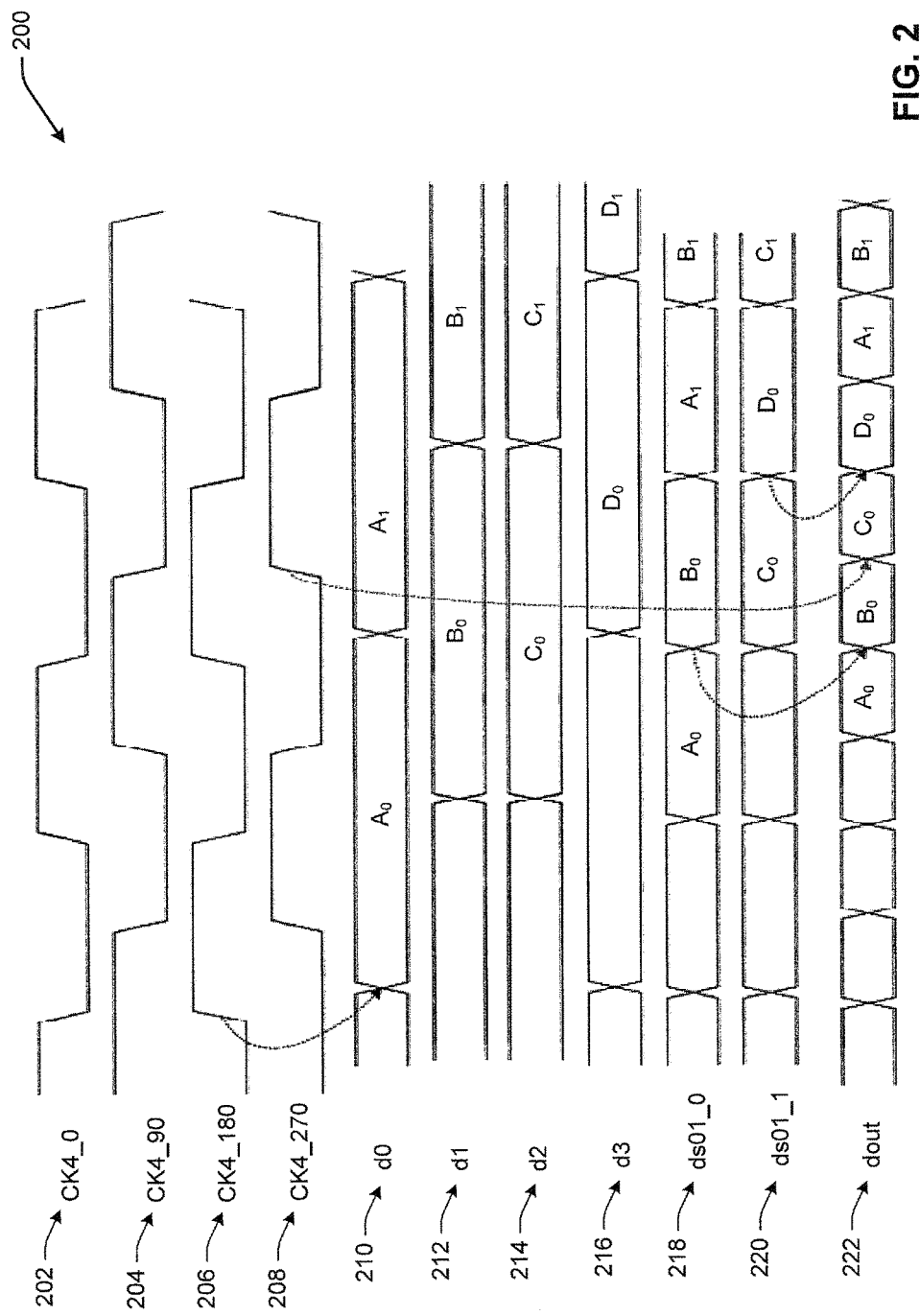
FIG. 2 presents an example timing diagram relating to converting multiple data streams to a serialized data stream by the serializer component of FIG. 1 using quadrature clocks, in accordance with various aspects and embodiments of the disclosed subject matter.

Referring briefly to FIG. 2 (along with FIG. 1), FIG. 2 depicts an example timing diagram 200 relating to converting multiple data streams to a serialized data stream by the serializer component 100 (e.g., 4:1 serializer) using quadrature clocks, in accordance with various aspects and embodiments of the disclosed subject matter. The timing diagram 200 illustrates the timing of the first clock signal 202 (e.g., CK4_0), second clock signal 204 (e.g., CK4_90), third clock signal 206 (e.g., CK4_180), and fourth clock signal 208 (e.g., CK4_270), wherein the higher regions of a clock signal can indicate the clock signal is at a high level or binary value of 1 and the lower regions of the clock signal can indicate the clock signal is at a low level or binary value of 0.

The timing diagram 200 also illustrates the timing of the transfer of data $d_0$ 210 as output from the first input sub-component 104, based at least in part on the third clock signal 206; the timing of the transfer of data $d_1$ 212 out of the second input sub-component 106, based at least in part on the first clock signal 202; the timing of the transfer of data $d_2$ 214 as output from the third input sub-component 108, based at least in part on the first clock signal 202; and the timing of the transfer of data $d_3$ 216 out of the fourth input sub-component 110, based at least in part on the third clock signal 206. The timing diagram 200 also presents the timing of the transfer of the data ds1_0 218 comprising the first set of data bits of the first data stream transferred out of the first switch 114 of the first data path and the second set of data bits of the second data stream transferred out of the second switch 118 of the second data path, in accordance with the first clock signal 202 and third clock signal 206, respectively. The timing diagram 200 further depicts the timing of the transfer of the data ds1_1 220 comprising the third set of data bits of the third data stream transferred out of the third switch 122 of the third data path and the fourth set of data bits of the fourth data stream transferred out of the fourth switch 126 of the fourth data path, in accordance with the third clock signal 206 and first clock signal 202, respectively.

The timing diagram 200 further illustrates the timing of the transfer of the serialized data stream $d_{out}$ 222 (e.g., data bit $A_0$, data bit $B_0$, data bit $C_0$, data bit $D_0$, data bit $A_1$, data bit $B_1$, . . . ) as output from the serializer component 100, in accordance with the quadrature clock signals (e.g., first, second, third, and fourth clock signals) and the time-delayed clock signals generated by the time delay component 138 based at least in part on the second clock signal 204 and fourth clock signal 208.

As can be observed in the timing diagram 200, the data bit $A_0$ of the first data stream on data line $d_0$ 210 can be transferred out from the first input sub-component 104 at or near the time of the rising edge of the third clock signal 206. As also can be observed in the timing diagram 200, the data bit $A_0$ can be transferred out of the first switch 114 to data line ds1_0 at or near time of the rising edge of the first clock signal 202 associated with (e.g., supplied to) the first switch 114. The data bit $A_0$ can be transferred as output in the serialized data stream $d_{out}$ 222 from the serializer component 100, in accordance with the first time-delayed clock signal (e.g., CK4_90_DEL) received by the switch 130 from the timing delay component 138.

As also can be observed in the timing diagram 200 in FIG. 2 (and from FIG. 1), the data bit $B_0$ of the second data stream can be transferred as output in the serialized data stream $d_{out}$ 222 from the serializer component 100, in accordance with the first time-delayed clock signal (e.g., CK4_90_DEL) received by the switch 130 from the timing delay component 138. The data bit $C_0$ of the third data stream can be transferred as output in the serialized data stream $d_{out}$ 222 from the serializer component 100, in accordance with the second time-delayed clock signal (e.g., CK4_270_DEL) received by the switch 134 from the timing delay component 138. The data bit $D_0$ of the fourth data stream can be transferred as output in the serialized data stream $d_{out}$ 222 from the serializer component 100, in accordance with the second time-delayed clock signal received by the switch 134 from the timing delay component 138.

Figure 3:
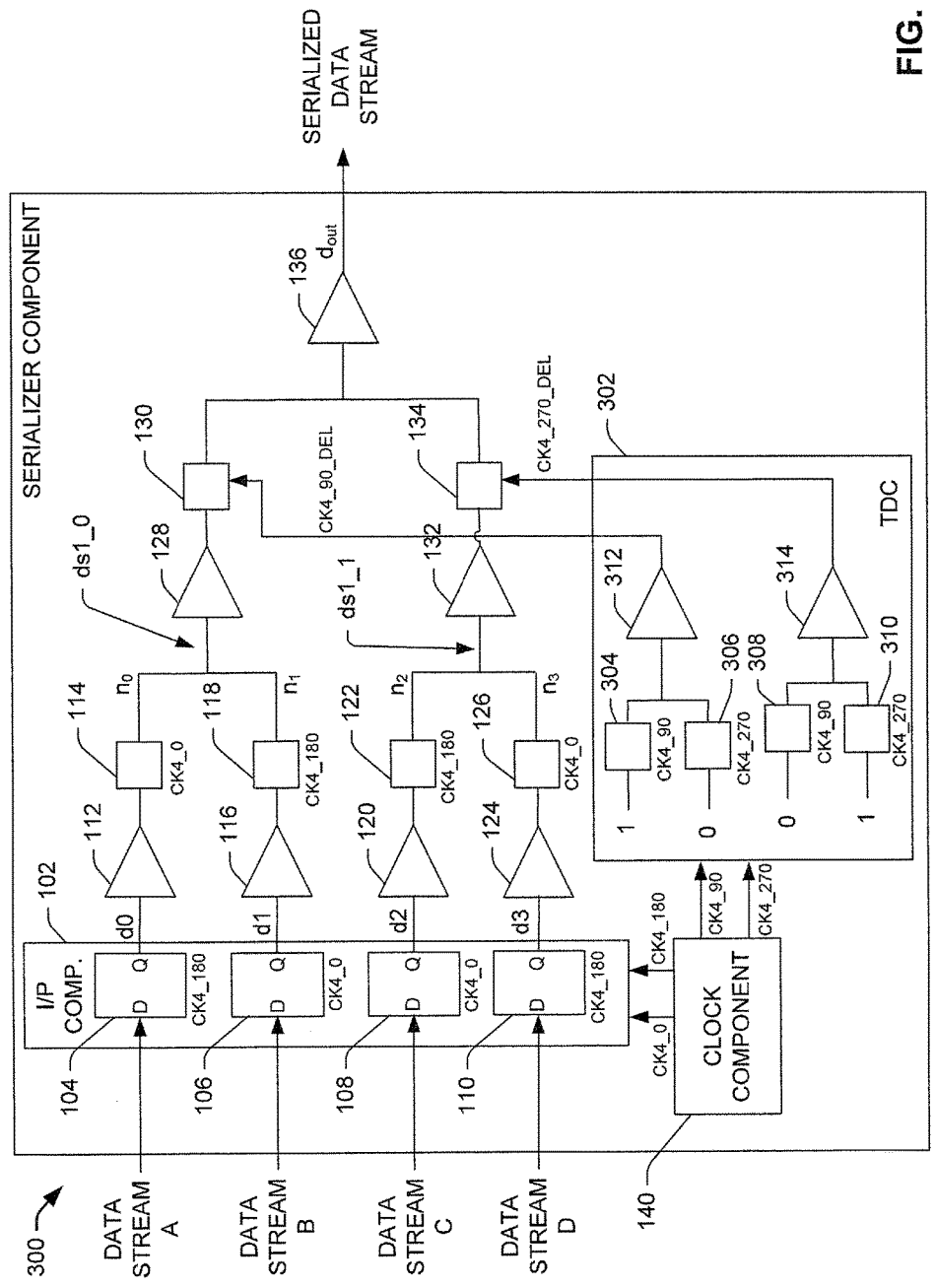
FIG. 3 presents a diagram of an example, non-limiting serializer component that can efficiently serialize multiple (e.g., multiple parallel) data streams using quadrature clocks and matching delay signals, in accordance with various aspects and embodiments of the disclosed subject matter.

Turning to FIG. 3, FIG. 3 presents a diagram of an example, non-limiting serializer component 300 that can efficiently serialize multiple (e.g., multiple parallel) data streams using quadrature clocks and matching time delay signals, in accordance with various aspects and embodiments of the disclosed subject matter. The serializer component 300 can comprise the input component 102, which can comprise the first input sub-component 104, second input sub-component 106, third input sub-component 108, and fourth input sub-component 110.

The serializer component 300 also can comprise the first buffer 112 and first switch 114, which, along with the first input sub-component 104, can be associated with the first data path. The serializer component 300 further can comprise the second buffer 116 and second switch 118, wherein the second input sub-component 106, second buffer 116, and second switch 118 can be associated with the second data path. The serializer component 300 also can comprise the third buffer 120 and third switch 122, which, along with the third input sub-component 108, can be associated with the third data path. The serializer component 300 further can comprise the fourth buffer 124 and fourth switch 126, wherein the fourth input sub-component 110, fourth buffer 124, and fourth switch 126 can be associated with the fourth data path.

The serializer component 300 further can include the fifth buffer 128 and fifth switch 130 that can be associated with a data path that can be associated with the first data path and the second data path, wherein the node $n_1$ associated with the first data path and the node $n_2$ associated with the second data path can be shorted together, as disclosed herein. The serializer component 300 also can comprise the sixth buffer 132 and sixth switch 134 that can be associated with the other data path that can be associated with the third data path and the fourth data path, wherein the node $n_2$ associated with the third data path and the node $n_3$ associated with the fourth data path can be shorted together, as disclosed herein. The outputs of the fifth switch 130 and sixth switch can be associated with the seventh buffer 136 (e.g., output buffer) that can be on a single data path that can provide the serialized data stream as an output from the seventh buffer 136 and from the serializer component 300.

The serializer component 300 also can comprise or be associated with the clock component 140 that can provide respective clock signals to the various components (e.g., input sub-components, switches, time delay component) of the serializer component 300 via respective clock supply lines between the clock component 140 and the various components of the serializer component 300. The clock signals can cycle at a desired speed, as disclosed herein.

The respective components (e.g., first, second, third, and fourth input sub-components; first, second, third, fourth, fifth, sixth, and seventh buffers; first, second, third, fourth, fifth, and sixth switches) of the serializer component 300 can be the same or substantially the same as, and/or can comprise the same or similar functionality as, the corresponding components described with regard to the serializer component 100 of FIG. 1 and/or the systems, methods, and/or components disclosed herein.

The serializer component 300 also can comprise a time delay component 302 that can be associated with (e.g., connected to) the fifth switch 130 and the sixth switch 134 to facilitate implementing time-delayed clock signals (e.g., matching time-delayed clock signals) that can be applied to the clock inputs (e.g., clock input ports) of the fifth switch 130 and sixth switch 134 to facilitate controlling the timing of the outputting or transferring of the respective data bits from the fifth switch 130 and from the sixth switch 134.

In some implementations, the time delay component 302 can comprise switch 304, switch 306, switch 308, and switch 310. The switch 304 can receive a high level or binary 1 value at its input port, and can receive the second clock signal (e.g., CK4_90) at its clock port. The switch 306 can receive a low level or binary 0 value at its input port, and can receive the fourth clock signal (e.g., CK4_270) at its clock port. The switch 308 can receive a low level or binary 0 value at its input port, and can receive the second clock signal (e.g., CK4_90) at its clock port. The switch 310 can receive a high level or binary 1 value at its input port, and can receive the fourth clock signal (e.g., CK4_270) at its clock port.

The output ports of the switch 304 and switch 306 can be associated with (e.g., communicatively connected to) an input port of a buffer 312. The output ports of the switch 308 and switch 310 can be associated with (e.g., communicatively connected to) an input port of a buffer 314. The output of the buffer 312 can be associated with the clock port of the fifth switch 130. The output of the buffer 314 can be associated with the clock port of the sixth switch 134.

The switch 304, switch 306, and buffer 312 can be employed to provide the first matching delay (e.g., first time-delayed clock signal). The switch 308, switch 310, and buffer 314 can be employed to provide the second matching delay (e.g., second time-delayed clock signal).

With regard to the first matching delay (e.g., first time-delayed clock signal), in response to the second clock signal transitioning to or being at a high level or binary 1 level, the switch 304 can provide (e.g., transfer) the high level or 1 signal at its input port as an output to the buffer 312, and the buffer 312 can provide the high level or 1 signal as an output from the time delay component 302 to the clock port of the fifth switch 130. In response to receiving the high level or 1 signal at the clock port, the fifth switch 130 can switch to transfer the data bit at its input port to its output port to provide such data bit as an output to the output buffer 136.

In response to the fourth clock signal transitioning to or being at a high level or binary 1 level, the switch 306 can provide the low level or 0 signal as an output to the buffer 312, and the buffer 312 can provide the low level or 0 signal as an output from the time delay component 302 to the clock port of the fifth switch 130. In response to receiving the low level or 0 signal at the clock port, the fifth switch 130 can be in or switched to prevent or not allow the transferring of data from its input port to its output port.

With regard to the second matching delay (e.g., second time-delayed clock signal), in response to the second clock signal transitioning to or being at a high level or binary 1 level, the switch 308 can provide the low level or 0 signal as an output to the buffer 314, and the buffer 314 can provide the low level or 0 signal as an output from the time delay component 302 to the clock port of the sixth switch 134. In response to receiving the low level or 0 signal at the clock port, the sixth switch 134 can be in or switched to prevent or not allow the transferring of data from its input port to its output port.

In response to the fourth clock signal transitioning to or being at a high level or binary 1 level, the switch 310 can provide (e.g., transfer) the high level or 1 signal at its input port as an output to the buffer 314, and the buffer 314 can provide the high level or 1 signal as an output from the time delay component 302 to the clock port of the sixth switch 134. In response to receiving the high level or 1 signal at the clock port, the sixth switch 134 can switch states (e.g., to an open switch state) to transfer the data bit at its input port to its output port to provide such data bit as an output to the output buffer 136.

Employing the time delay component 302 and the timing arrangements of the clock signals provided to the various components of the serializer component 300 by the clock component 140 and the first and second matching delay signals of the time delay component 302, the serializer component 300 can efficiently transfer the data bits of the multiple data streams and convert the multiple data streams to a single serialized data stream. When the first clock signal transitions to or is at a high level (e.g., binary 1 value), the first switch 114 can transfer the data bit (e.g., $A_O$) of the first data stream to the buffer 128 and the data bit can be transferred from the buffer 128 to the input of the fifth switch 130. When the second clock signal is at a high level (e.g., binary 1 value), the fifth switch 130 can transfer the data bit (e.g., $A_O$) of the first data stream to the output buffer 136, wherein the output buffer can provide the data bit (e.g., $A_O$) of the first data stream as an output from the serializer component 300.

With regard to the data of the second data stream, when the third clock signal transitions to or is at a high level, the second switch 118 can transfer the data bit (e.g., $B_O$) of the second data stream to the buffer 128 and the data bit can be transferred from the buffer 128 to the input of the fifth switch 130. Also, at that time, the second clock signal can still be at a high level, and, in response to the second clock signal being at a high level, the fifth switch 130 can transfer the data bit (e.g., $B_O$) of the second data stream to the output buffer 136, wherein the output buffer can provide the data bit (e.g., $B_O$) of the second data stream as an output from the serializer component 300.

With regard to the data of the third data stream, when the third clock signal transitions to or is at a high level, the third switch 122 can transfer the data bit (e.g., $C_O$) of the third data stream to the buffer 132 and the data bit can be transferred from the buffer 132 to the input of the sixth switch 134. When the fourth clock signal is at a high level (e.g., binary 1 value), the sixth switch 134 can switch states (e.g., from a closed state to an open state) to transfer the data bit (e.g., $C_O$) of the third data stream to the output buffer 136, wherein the output buffer can provide the data bit (e.g., $C_O$) of the third data stream as an output from the serializer component 300.

Regarding the data of the fourth data stream, when the first clock signal transitions to or is at a high level, the fourth switch 126 can switch states (e.g., from a closed state to an open state) to transfer the data bit (e.g., $D_O$) of the fourth data stream to the buffer 132 and the data bit can be transferred from the buffer 132 to the input of the sixth switch 134. Also, at that time, the fourth clock signal can still be at a high level, and, in response to the fourth clock signal being at a high level, the sixth switch 134 can transfer the data bit (e.g., $D_O$) of the fourth data stream to the output buffer 136, wherein the output buffer can provide the data bit (e.g., $D_O$) of the fourth data stream as an output from the serializer component 300.

Figure 4:
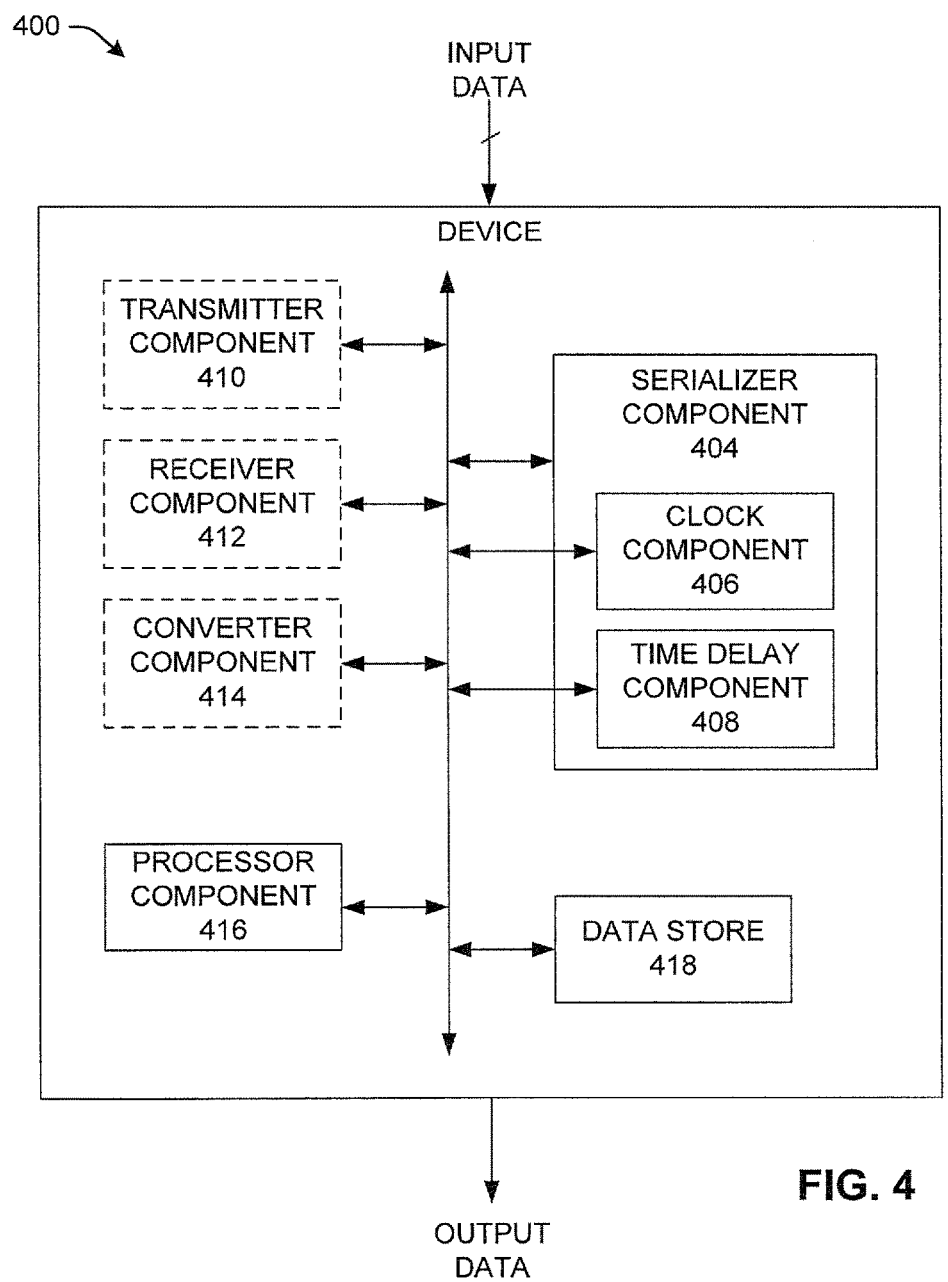
FIG. 4 illustrates a block diagram of an example, non-limiting embodiment of a system that can employ a serializer component, in accordance with various aspects and embodiments of the disclosed subject matter.

FIG. 4 illustrates a block diagram of an example, non-limiting embodiment of a system 400 that can employ a serializer component, in accordance with various aspects and embodiments of the disclosed subject matter. In accordance with various implementations, the system 400 can comprise a device 402 that can be or can comprise a transceiver, a transmitter, a DAC converter, a router, a modem, or other type of device that can communicate and/or convert data.

The device 402 can comprise a serializer component 404 that can efficiently serialize multiple (e.g., multiple parallel) data streams using quadrature clocks and matching time delay signals, in accordance with various aspects and embodiments of the disclosed subject matter. The serializer component 404 can be configured, and can operate or function, as more fully described herein. In accordance with various implementations, the serializer component 404 can be an x-to-y serializer component (e.g., a 4-to-1 serializer component).

The serializer component 404 can comprise a clock component 406 that can generate various clock signals, such as quadrature clock signals, that can be employed by the serializer component 404 to facilitate controlling respective switching of the respective switches and input sub-components of the serializer component 404 and to facilitate generation of matching time delay signals by the time delay component 406. For instance, the clock component 406 can generate the first clock signal (e.g., CK4_0), second clock signal (e.g., CK4_90), third clock signal (e.g., CK4_180), and fourth clock signal (e.g., CK4_270).

The time delay component 406 can generate respective matching time delay signals based at least in part on the second clock signal and the fourth clock signal. The time delay component 406 can provide (e.g., communicate, supply) a first matching time delay signal (e.g., CK4_90_DEL) to a clock port of a switch (e.g., the fifth switch) associated with the first data path and second data path to facilitate controlling switching of such switch (e.g., controlling transition of such switch between different states, such as a closed state and an open or transfer state). The time delay component 406 also can provide a second matching time delay signal (e.g., CK4_270_DEL) to a clock port of another switch (e.g., the sixth switch) associated with the third data path and fourth data path to facilitate controlling switching of such other switch (e.g., controlling transition of such switch between different states, such as a closed state and an open or transfer state). In some implementations, the time delay component 406 also can provide other time delay signals to facilitate controlling switching states of switches or controlling operation of other components of the serializer component 404. The time delay component 406 can be configured, and can operate or function, as more fully described herein.

The device 402 (e.g., optionally) can comprise a transmitter component 410, a receiver component 412, and/or a converter component 414. The transmitter component 410 can comprise one or more transmitter sub-components (e.g., transmitters) that can facilitate transmitting voice information or data from the device 402 (e.g., a transceiver or transmitter device) to a communication device that is communicatively connected to the device 402 via a wireline, optical, or wireless communication connection (e.g., communication channel). In some implementations, the transmitter component 410 can include, for example, a set (e.g., 2, 3, 4, . . . ) of transmitter sub-components.

The receiver component 412 can comprise one or more receiver sub-components (e.g., receivers) that can facilitate receiving voice information or data from a communication device that is communicatively connected to the device 402 via a wireline, optical, or wireless communication connection (e.g., communication channel). In some implementations, the receiver component 412 can include, for example, a set (e.g., 2, 3, 4, . . . ) of receiver sub-components.

The converter component 414 can convert data from one format to another format. For example, the converter component 414 can convert a digital signal (e.g., digital data signal) to an analog signal (e.g., analog data signal), wherein, for example, the analog signal can be provided as an output, as desired. For instance, the converter component 414 can be or can comprise a DAC for converting digital data streams to analog data streams.

The device 402 can comprise a processor component 416 that can operate in conjunction with the other components (e.g., serializer component 404, transmitter component 410, receiver component 412, converter component 414) to facilitate performing the various functions of the system 400, such as disclosed herein. The processor component 416 can employ one or more processors (e.g., central processing units (CPUs), graphical processing units (GPUs), field-programmable gate arrays (FPGAs)), microprocessors, or controllers that can process data, such as information (e.g., voice or data information) relating to operations performed by the system 400, etc., to facilitate converting data streams to a serialized data stream, transmitting signals, receiving signals, converting data from one format to another format, performing calculations, filtering signals, and/or performing other operations; and can control data flow between the device 402 and other components associated with (e.g., connected to) the device 402 and can control data flow between various components of the device 402.

In yet another aspect, the device 402 also can include a data store 418 that can store data structures (e.g., voice information, data, metadata); code structure(s) (e.g., modules, objects, classes, procedures), commands, or instructions; information relating to converting data streams to a serialized data stream, transmitting signals, receiving signals, converting data from one format to another format, performing calculations, filtering signals, and/or performing other operations; parameter data; information relating to algorithms (e.g., algorithm(s) relating to transmitting data, algorithm(s) relating to receiving data, algorithm(s) relating to converting data); and so on. In an aspect, the processor component 416 can be functionally coupled (e.g., through a memory bus) to the data store 418 in order to store and retrieve information desired to operate and/or confer functionality, at least in part, to the serializer component 404, transmitter component 410, receiver component 412, converter component 414, etc., and/or substantially any other operational aspects of the device 402. It is to be appreciated and understood that the various components of the device 402 can communicate information between each other and/or between other components associated with the device 402 as desired to carry out operations of the device 402. It is to be further appreciated and understood that respective components (e.g., serializer component 404, clock component 406, time delay component 408, transmitter component 410, receiver component 412, converter component 414) of the device 402 each can be a stand-alone unit, can be included within the device 402 (as depicted), can be incorporated within another component of the device 402 (e.g., clock component 406 and time delay component 408 within the serializer component 404, as depicted) or a component separate from the device 402, and/or virtually any suitable combination thereof, as desired.

Figure 5:
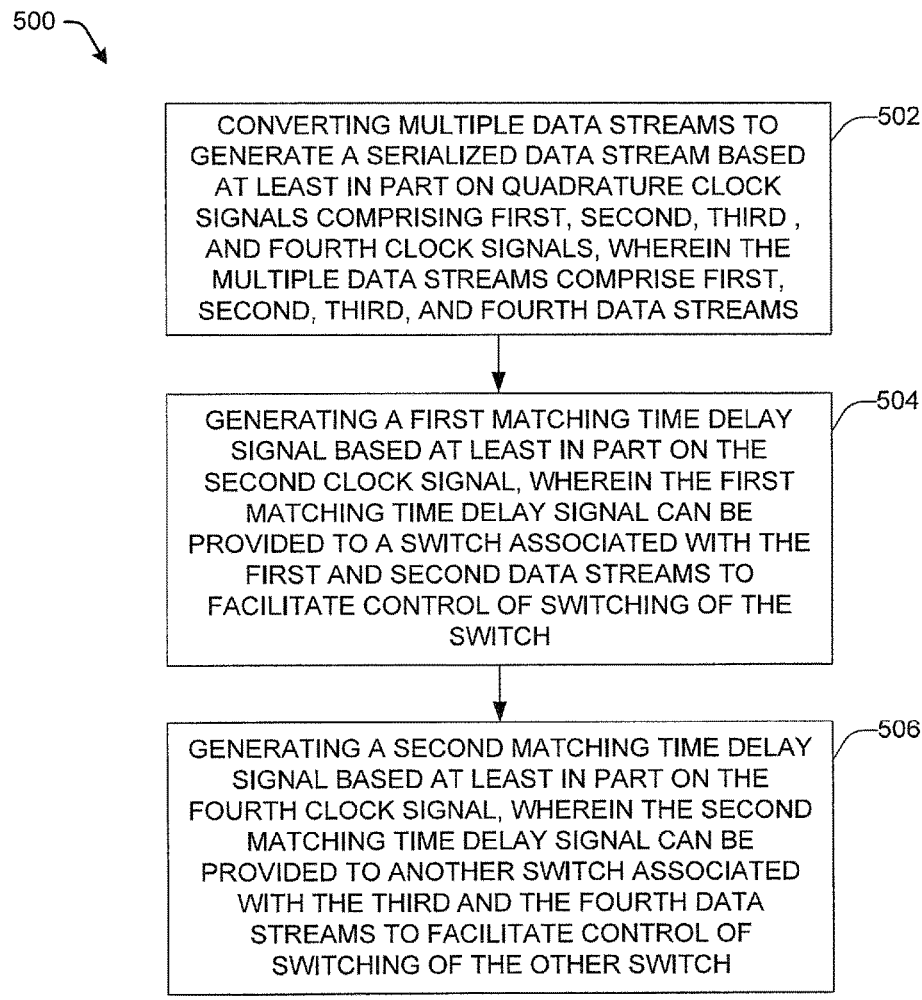
FIG. 5 depicts a flow diagram of an example method that can efficiently serialize multiple (e.g., multiple parallel) data streams using quadrature clocks and matching delay signals, in accordance with various aspects and embodiments of the disclosed subject matter.
Figure 6:
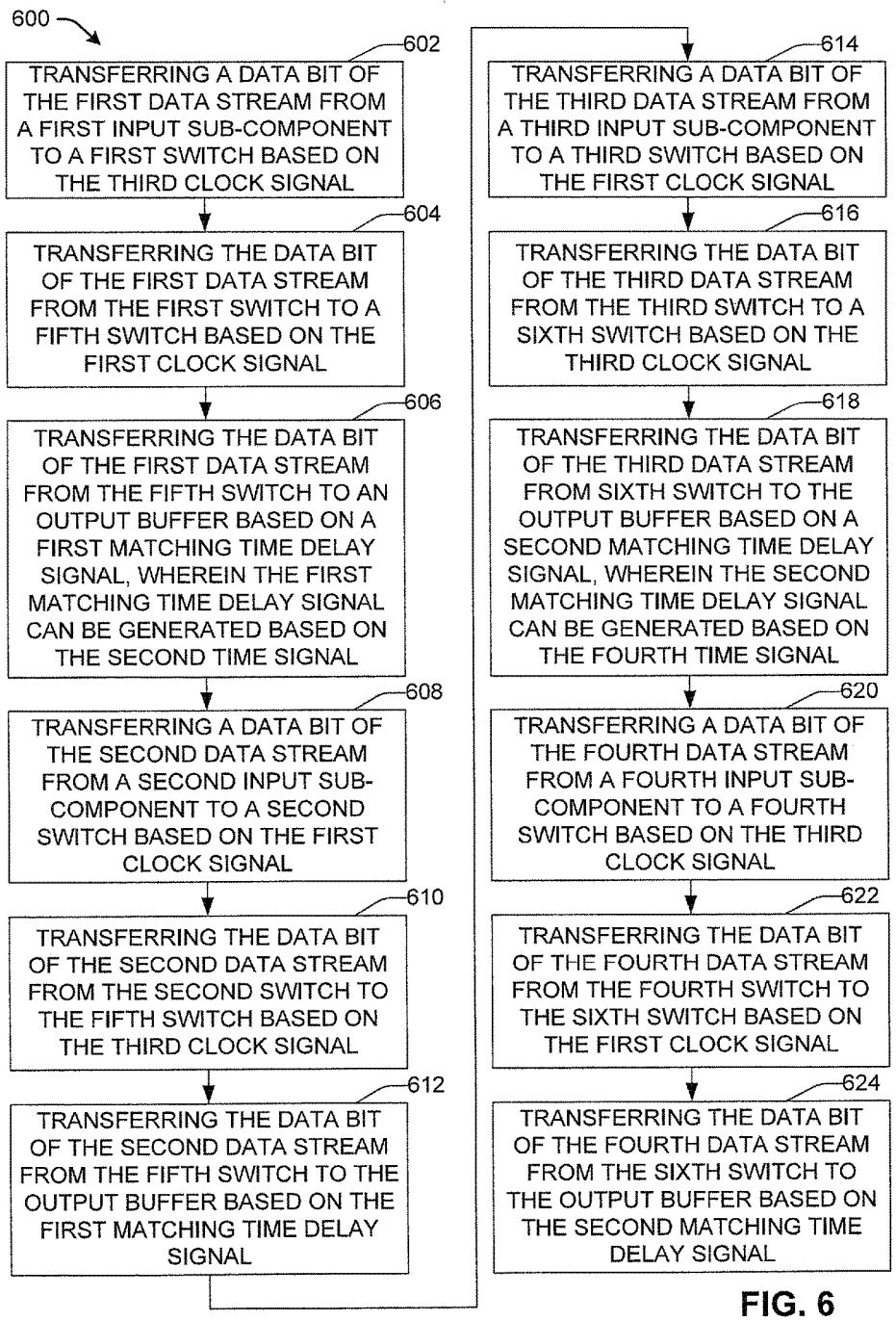
FIG. 6 illustrates a flow diagram of another example method that can efficiently serialize multiple (e.g., multiple parallel) data streams using quadrature clocks and matching delay signals, in accordance with various aspects and embodiments of the disclosed subject matter.
Figure 7:
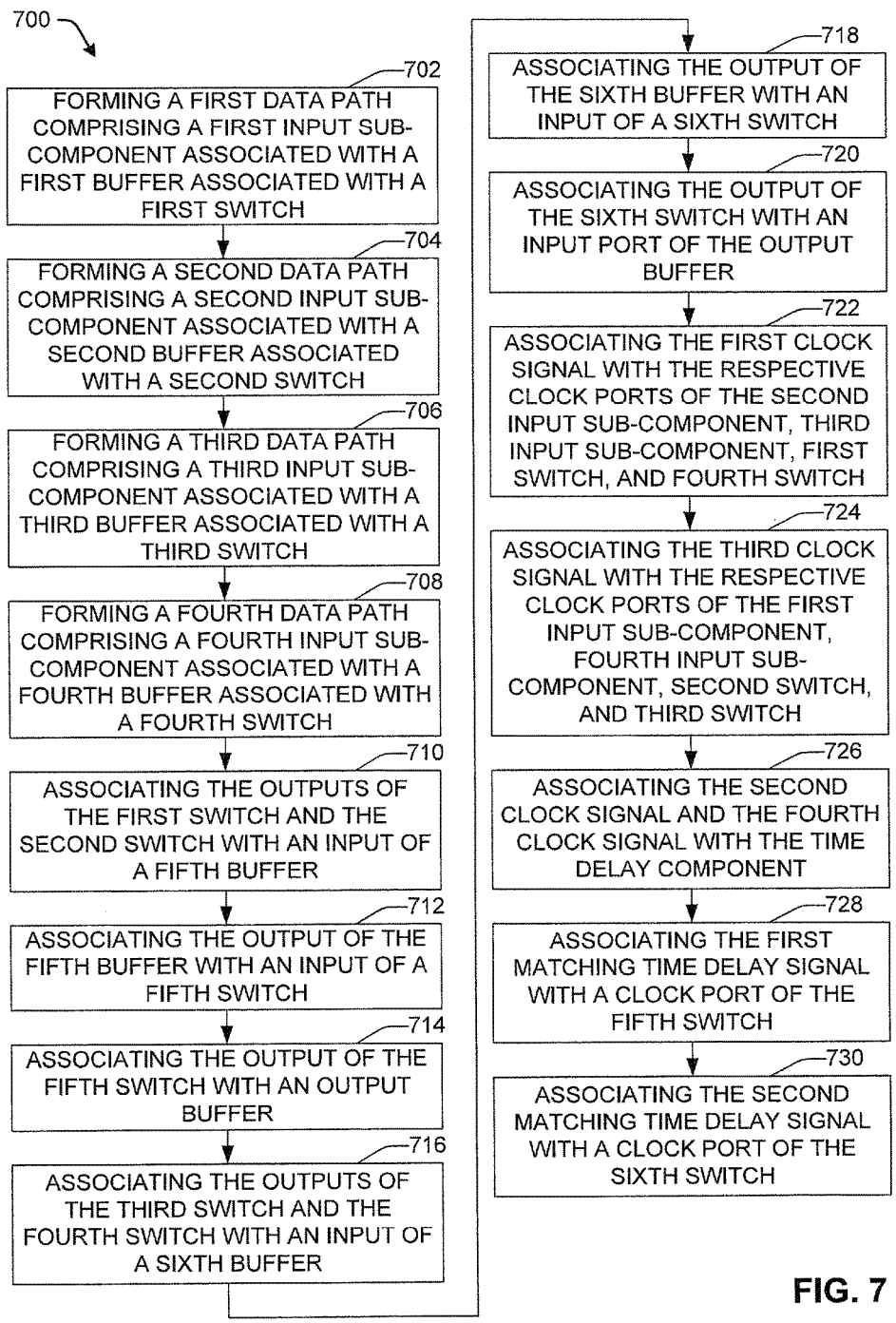
FIG. 7 presents a flow diagram of an example method for constructing a serializer component that can efficiently serialize multiple data streams using quadrature clocks and matching delay signals, in accordance with various aspects and embodiments of the disclosed subject matter.

In view of the example systems described above, methods that may be implemented in accordance with the described subject matter may be better appreciated with reference to the flow charts of FIGS. 5-7. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 5 depicts a flow diagram of an example method 500 that can efficiently serialize multiple (e.g., multiple parallel) data streams using quadrature clocks and matching delay signals, in accordance with various aspects and embodiments of the disclosed subject matter. The method 500 can be implemented by a serializer component, for example.

At block 502, multiple data streams can be converted to generate a serialized data stream based at least in part on quadrature clock signals comprising a first clock signal, a second clock signal, a third clock signal, and a fourth clock signal, wherein the multiple data streams comprise a first data stream, a second data stream, a third data stream, and a fourth data stream. The serializer component can receive the multiple data streams (e.g., in parallel). The serializer component can convert the multiple data streams to generate the serialized data stream based at least in part on the quadrature clock signals (e.g., the first clock signal, the second clock signal, the third clock signal, and the fourth clock signal).

At block 504, a first matching time delay signal (e.g., first time-delayed clock signal) can be generated based at least in part on the second clock signal, wherein the first matching time delay signal can be provided to a switch (e.g., the fifth switch of the serializer component) associated with the first data stream and the second data stream to facilitate control of switching of the switch. A time delay component of the serializer component can generate the first matching time delay signal, based at least in part on the level or value of the second clock signal and an input level or value (e.g., a high level or 1 value, or a low level or 0 value). The time delay component can provide the first matching time delay signal to the clock port of the switch (e.g., fifth switch) associated with (e.g., that can receive data bits of) the first data stream and the second data stream to facilitate controlling switching of the switch to facilitate controlling the transfer of data bits from the switch to the output buffer of the serializer component.

At block 506, a second matching time delay signal (e.g., a second time-delayed clock signal) can be generated based at least in part on the fourth clock signal, wherein the second matching time delay signal can be provided to another switch (e.g., the sixth switch of the serializer component) associated with the third data stream and the fourth data stream to facilitate control of switching of the other switch. The time delay component can generate the second matching time delay signal, based at least in part on the level or value of the fourth clock signal and an input level or value (e.g., a high level or 1 value, or a low level or 0 value). The time delay component can provide the second matching time delay signal to the clock port of the other switch (e.g., sixth switch) associated with (e.g., that can receive data bits of) the third data stream and the fourth data stream to facilitate controlling switching of the other switch to facilitate controlling the transfer of data bits from the other switch to the output buffer of the serializer component. The controlling of the switching of the switch (e.g., the fifth switch) and the other switch (e.g., sixth switch) using the first and second matching time delay signals, respectively, can facilitate the converting of the multiple data streams to generate the serialized data stream, which can comprise the data bits of the multiple data streams in a serialized form with the data bits in a desired order.

FIG. 6 illustrates a flow diagram of another example method 600 that can efficiently serialize multiple (e.g., multiple parallel) data streams using quadrature clocks and matching delay signals, in accordance with various aspects and embodiments of the disclosed subject matter. The method 600 can be implemented by a serializer component, for example. The method 600 can be employed to convert multiple data streams, which can be received in parallel by the serializer component, to generate a single serialized data stream that can comprise the data bits of the multiple data streams in a desired order. The multiple data streams can comprise, for example, a first data stream, second data stream, third data stream, and fourth data stream.

At block 602, for each data bit of the first data stream, a data bit of the first data stream can be transferred from a first input sub-component to a first switch based at least in part on the third clock signal. The first input sub-component can transfer the data bit of the first data stream to the first switch, via a first buffer that can be situated between the output of the first input sub-component and the input of the first switch, in response to the first input sub-component receiving, from the clock component, the third clock signal that has transitioned to or is at a high level or value.

At block 604, for each data bit of the first data stream, the data bit of the first data stream can be transferred from the first switch to a fifth switch based at least in part on the first clock signal. The first switch can transition states (e.g., from a closed state to an open state) to transfer the data bit of the first data stream to the fifth switch, via a fifth buffer that can be situated between the output of the first switch and the input of the fifth switch, in response to the first switch receiving, from the clock component, the first clock signal that has transitioned to or is at a high level or value.

At block 606, for each data bit of the first data stream, the data bit of the first data stream can be transferred from the fifth switch to an output buffer based at least in part on a first matching time delay signal, wherein the first matching time delay signal can be generated based at least in part on the second time signal. The fifth switch can transition states (e.g., from a closed state to an open state) to transfer the data bit of the first data stream to the output buffer for output from the serializer component, in response to the fifth switch receiving, from the time delay component of the serializer component, the first matching time delay signal that has transitioned to or is at a high level or value.

At block 608, for each data bit of the second data stream, a data bit of the second data stream can be transferred from a second input sub-component to a second switch based at least in part on the first clock signal. The second input sub-component can transfer the data bit of the second data stream to the second switch, via a second buffer that can be situated between the output of the second input sub-component and the input of the second switch, in response to the second input sub-component receiving, from the clock component, the first clock signal that has transitioned to or is at a high level or value.

At block 610, for each data bit of the second data stream, the data bit of the second data stream can be transferred from the second switch to the fifth switch based at least in part on the third clock signal. The second switch can transition states (e.g., from a closed state to an open state) to transfer the data bit of the second data stream to the fifth switch, via the fifth buffer, in response to the second switch receiving, from the clock component, the third clock signal that has transitioned to or is at a high level or value.

At block 612, for each data bit of the second data stream, the data bit of the second data stream can be transferred from the fifth switch to the output buffer based at least in part on the first matching time delay signal. The fifth switch can transition states (e.g., from a closed state to an open state) to transfer the data bit of the second data stream to the output buffer for output from the serializer component, in response to the fifth switch receiving, from the time delay component, the first matching time delay signal that has transitioned to or is at a high level or value.

At block 614, for each data bit of the third data stream, a data bit of the third data stream can be transferred from a third input sub-component to a third switch based at least in part on the first clock signal. The third input sub-component can transfer the data bit of the third data stream to the third switch, via a third buffer that can be situated between the output of the third input sub-component and the input of the third switch, in response to the third input sub-component receiving, from the clock component, the first clock signal that has transitioned to or is at a high level or value.

At block 616, for each data bit of the third data stream, the data bit of the third data stream can be transferred from the third switch to a sixth switch based at least in part on the third clock signal. The third switch can transition states (e.g., from a closed state to an open state) to transfer the data bit of the third data stream to the sixth switch, via a sixth buffer that can be situated between the output of the third switch and the input of the sixth switch, in response to the third switch receiving, from the clock component, the third clock signal that has transitioned to or is at a high level or value.

At block 618, for each data bit of the third data stream, the data bit of the third data stream can be transferred from the sixth switch to the output buffer based at least in part on a second matching time delay signal, wherein the second matching time delay signal can be generated based at least in part on the fourth time signal. The sixth switch can transition states (e.g., from a closed state to an open state) to transfer the data bit of the third data stream to the output buffer for output from the serializer component, in response to the sixth switch receiving, from the time delay component, the second matching time delay signal that has transitioned to or is at a high level or value.

At block 620, for each data bit of the fourth data stream, a data bit of the fourth data stream can be transferred from a fourth input sub-component to a fourth switch based at least in part on the third clock signal. The fourth input sub-component can transfer the data bit of the fourth data stream to the fourth switch, via a fourth buffer that can be situated between the output of the fourth input sub-component and the input of the fourth switch, in response to the fourth input sub-component receiving, from the clock component, the third clock signal that has transitioned to or is at a high level or value.

At block 622, for each data bit of the fourth data stream, the data bit of the fourth data stream can be transferred from the fourth switch to the sixth switch based at least in part on the first clock signal. The fourth switch can transition states (e.g., from a closed state to an open state) to transfer the data bit of the fourth data stream to the sixth switch, via the sixth buffer, in response to the fourth switch receiving, from the clock component, the first clock signal that has transitioned to or is at a high level or value.

At block 624, for each data bit of the fourth data stream, the data bit of the fourth data stream can be transferred from the sixth switch to the output buffer based at least in part on the second matching time delay signal. The sixth switch can transition states (e.g., from a closed state to an open state) to transfer the data bit of the fourth data stream to the output buffer for output from the serializer component, in response to the sixth switch receiving, from the time delay component, the second matching time delay signal that has transitioned to or is at a high level or value.

FIG. 7 presents a flow diagram of an example method 700 for constructing a serializer component that can efficiently serialize multiple (e.g., multiple parallel) data streams using quadrature clocks and matching delay signals, in accordance with various aspects and embodiments of the disclosed subject matter. The method 700 can be implemented by one or more component fabrication devices, for example. The one or more component fabrication devices can comprise or be associated with, for example, a computer.

At block 702, a first data path can be formed, wherein the first data path can comprise a first input sub-component associated with a first buffer that can be associated with a first switch. The component fabrication device can form the first data path, wherein the output of the first input sub-component can be associated with (e.g., connected to) the input of the first buffer, and the output of the first buffer can be associated with the input of the first switch.

At block 704, a second data path can be formed, wherein the second data path can comprise a second input sub-component associated with a second buffer that can be associated with a second switch. The component fabrication device can form the second data path, wherein the output of the second input sub-component can be associated with (e.g., connected to) the input of the second buffer, and the output of the second buffer can be associated with the input of the second switch.

At block 706, a third data path can be formed, wherein the third data path can comprise a third input sub-component associated with a third buffer that can be associated with a third switch. The component fabrication device can form the third data path, wherein the output of the third input sub-component can be associated with (e.g., connected to) the input of the third buffer, and the output of the third buffer can be associated with the input of the third switch.

At block 708, a fourth data path can be formed, wherein the fourth data path can comprise a fourth input sub-component associated with a fourth buffer that can be associated with a fourth switch. The component fabrication device can form the fourth data path, wherein the output of the fourth input sub-component can be associated with (e.g., connected to) the input of the fourth buffer, and the output of the fourth buffer can be associated with the input of the fourth switch.

At block 710, the outputs of the first switch and the second switch can be associated with an input of a fifth buffer. The component fabrication device can associate the outputs of the first switch and the second switch with the input of the fifth buffer.

At block 712, the output of the fifth buffer can be associated with an input of a fifth switch. The component fabrication device can associate the output of the fifth buffer with the input of the fifth switch.

At block 714, the output of the fifth switch can be associated with an output buffer. The component fabrication device can associate the output of the fifth switch with the input of the output buffer.

At block 716, the outputs of the third switch and the fourth switch can be associated with an input of a sixth buffer. The component fabrication device can associate the outputs of the third switch and the fourth switch with the input of the sixth buffer.

At block 718, the output of the sixth buffer can be associated with an input of a sixth switch. The component fabrication device can associate the output of the sixth buffer with the input of the sixth switch.

At block 720, the output of the sixth switch can be associated with an input port of the output buffer. The component fabrication device can associate the output of the sixth switch with the input of the output buffer.

At block 722, the first clock signal can be associated with the respective clock ports of the second input sub-component, third input sub-component, first switch, and fourth switch. The component fabrication device can associate the first clock signal with (e.g., can connect the first clock signal to) the respective clock ports of the second input sub-component, third input sub-component, first switch, and fourth switch to facilitate providing the first clock signal to the respective clock ports of the second input sub-component, third input sub-component, first switch, and fourth switch.

At block 724, the third clock signal can be associated with the respective clock ports of the first input sub-component, fourth input sub-component, second switch, and third switch. The component fabrication device can associate the third clock signal with (e.g., can connect the third clock signal to) the respective clock ports of the first input sub-component, fourth input sub-component, second switch, and third switch to facilitate providing the third clock signal to the respective clock ports of the first input sub-component, fourth input sub-component, second switch, and third switch.

At block 726, the second clock signal and the fourth clock signal can be associated with the time delay component. The component fabrication device can associate (e.g., connect) the second clock signal and the fourth clock signal with the time delay component.

At block 728, the first matching time delay signal can be associated with a clock port of the fifth switch. The component fabrication device can associate (e.g., connect) the first matching time delay signal with the clock port of the fifth switch to facilitate providing the first matching time delay signal to the fifth switch.

At 730, the second matching time delay signal can be associated with a clock port of the sixth switch. The component fabrication device can associate (e.g., connect) the second matching time delay signal with the clock port of the sixth switch to facilitate providing the second matching time delay signal to the sixth switch.

Example Computing Environment

Figure 8:
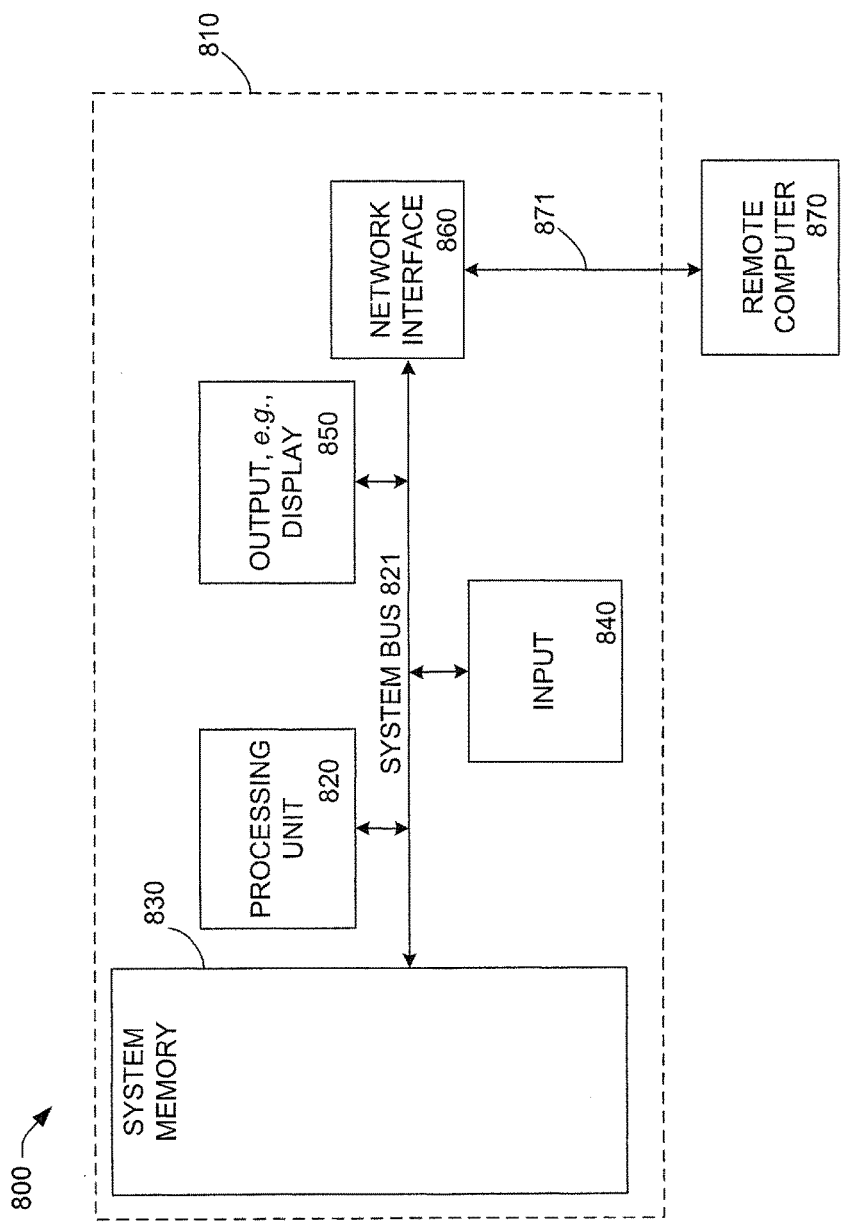
FIG. 8 illustrates a block diagram of an example electronic computing environment that can be implemented in conjunction with one or more aspects described herein.

As mentioned, advantageously, the techniques described herein can be applied to any device and/or network where the communication of data, including the converting of multiple data streams into a serialized data stream, is desirable in a system comprising a device (e.g., transceiver, transmitter, DAC). It is to be understood, therefore, that handheld, portable and other computing devices and computing objects of all kinds are contemplated for use in connection with the various non-limiting embodiments, e.g., anywhere that it can be desirable for a device to be employed to facilitate generation of a serializer component for use in converting multiple data streams into a serialized data stream, or to be employed to comprise or be associated with a serializer component to facilitate communication of data, including the converting of multiple data streams into a serialized data stream. Accordingly, the below general purpose remote computer described below in FIG. 8 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 8 thus illustrates an example of a suitable computing system environment 800 in which some aspects of the disclosed subject matter can be implemented, although as made clear above, the computing system environment 800 is only one example of a suitable computing environment for a device and is not intended to suggest any limitation as to the scope of use or functionality of the disclosed subject matter. Neither should the computing environment 800 be interpreted as having any dependency or requirement relating to any one or combination of components illustrated in the exemplary operating environment 800.

With reference to FIG. 8, an exemplary device for implementing the disclosed subject matter includes a general-purpose computing device in the form of a computer 810. Components of computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures.

Computer 810 typically includes a variety of computer readable media. Computer readable media can be any available media that can be accessed by computer 810. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 810. Communication media typically embodies computer readable instructions, data structures, program modules, or other data in a modulated data signal such as a carrier wave or other transport mechanism and includes any information delivery media.

The system memory 830 may include computer storage media in the form of volatile and/or nonvolatile memory such as read only memory (ROM) and/or random access memory (RAM). A basic input/output system (BIOS), containing the basic routines that help to transfer information between elements within computer 810, such as during start-up, may be stored in memory 830. Memory 830 typically also contains data and/or program modules that are immediately accessible to and/or presently being operated on by processing unit 820. By way of example, and not limitation, memory 830 may also include an operating system, application programs, other program modules, and program data.

The computer 810 may also include other removable/non-removable, volatile/nonvolatile computer storage media. For example, computer 810 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 821 through a non-removable memory interface such as an interface, and a magnetic disk drive or optical disk drive is typically connected to the system bus 821 by a removable memory interface, such as an interface.

A user can enter commands and information into the computer 810 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 820 through user input 840 and associated interface(s) that are coupled to the system bus 821, but may be connected by other interface and bus structures, such as a parallel port, game port, or a universal serial bus (USB). A graphics subsystem can also be connected to the system bus 821. A projection unit in a projection display device, or a HUD in a viewing device or other type of display device can also be connected to the system bus 821 via an interface, such as output interface 850, which may in turn communicate with video memory. In addition to a monitor, computers can also include other peripheral output devices such as speakers which can be connected through output interface 850.

The computer 810 can operate in a networked or distributed environment using logical connections to one or more other remote computer(s), such as remote computer 870, which can in turn have media capabilities different from device 810. The remote computer 870 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 810. The logical connections depicted in FIG. 8 include a network 871, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 810 can be connected to the LAN 871 through a network interface or adapter. When used in a WAN networking environment, the computer 810 can typically include a communications component, such as a modem, or other means for establishing communications over the WAN, such as the Internet. A communications component, such as wireless communications component, a modem and so on, which can be internal or external, can be connected to the system bus 821 via the user input interface of input 840, or other appropriate mechanism. In a networked environment, program modules depicted relative to the computer 810, or portions thereof, can be stored in a remote memory storage device. It will be appreciated that the network connections shown and described are exemplary and other means of establishing a communications link between the computers can be used.

Example Networking Environment

Figure 9:
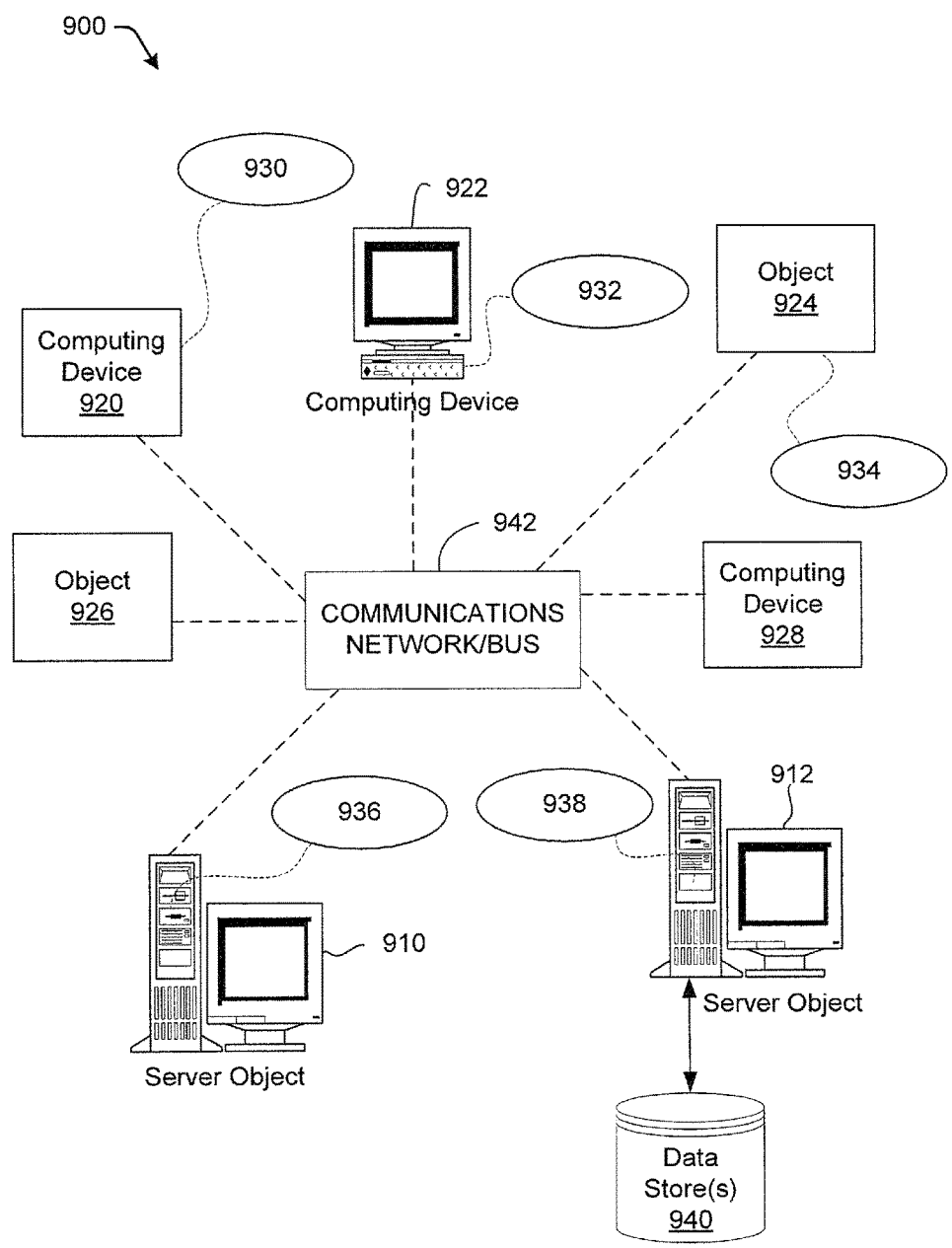
FIG. 9 depicts a block diagram of an example data communication network that can be operable in conjunction with various aspects described herein.

FIG. 9 provides a schematic diagram of an exemplary networked or distributed computing environment 900. The distributed computing environment comprises computing objects 910, 912, etc. and computing objects or devices 920, 922, 924, 926, 928, etc., which may include programs, methods, data stores, programmable logic, etc., as represented by applications 930, 932, 934, 936, 938 and data store(s) 940. It can be appreciated that computing objects 910, 912, etc. and computing objects or devices 920, 922, 924, 926, 928, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 940 can include one or more cache memories, one or more registers, or other similar data stores disclosed herein.

Each computing object 910, 912, etc. and computing objects or devices 920, 922, 924, 926, 928, etc. can communicate with one or more other computing objects 910, 912, etc. and computing objects or devices 920, 922, 924, 926, 928, etc. by way of the communications network 942, either directly or indirectly. Even though illustrated as a single element in FIG. 9, communications network 942 may comprise other computing objects and computing devices that provide services to the system of FIG. 9, and/or may represent multiple interconnected networks, which are not shown. Each computing object 910, 912, etc. or computing object or devices 920, 922, 924, 926, 928, etc. can also contain an application, such as applications 930, 932, 934, 936, 938, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 9, as a non-limiting example, computing objects or devices 920, 922, 924, 926, 928, etc. can be thought of as clients and computing objects 910, 912, etc. can be thought of as servers where computing objects 910, 912, etc., acting as servers provide data services, such as receiving data from client computing objects or devices 920, 922, 924, 926, 928, etc., storing of data, processing of data, transmitting data to client computing objects or devices 920, 922, 924, 926, 928, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 942 or bus is the Internet, for example, the computing objects 910, 912, etc. can be Web servers with which other computing objects or devices 920, 922, 924, 926, 928, etc. communicate via any of a number of known protocols, such as the hypertext transfer protocol (HTTP). Computing objects 910, 912, etc. acting as servers may also serve as clients, e.g., computing objects or devices 920, 922, 924, 926, 928, etc., as may be characteristic of a distributed computing environment.

Reference throughout this specification to "one embodiment," "an embodiment," "an example," "an implementation," "a disclosed aspect," or "an aspect" means that a particular feature, structure, or characteristic described in connection with the embodiment, implementation, or aspect is included in at least one embodiment, implementation, or aspect of the present disclosure. Thus, the appearances of the phrase "in one embodiment," "in one example," "in one aspect," "in an implementation," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methodologies for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A data transmitting system, comprising:
   a serializer component that is configured to convert multiple data streams to a serialized data stream based at least in part on quadrature clock signals comprising a first clock signal, a second clock signal, a third clock signal, and a fourth clock signal, the multiple data streams comprising a first data stream, a second data stream, a third data stream, and a fourth data stream; and
   a time delay component that is configured to generate a first time-delayed clock signal based at least in part on the second clock signal, and generates a second time-delayed clock signal based at least in part on the fourth clock signal, the time delay component providing the first time-delayed clock signal to a switch associated with the first data stream and the second data stream to facilitate control of switching of the switch, and providing the second time-delayed clock signal to another switch associated with the third data stream and the fourth data stream to facilitate control of switching of the other switch.

2. The system of claim 1, wherein the serializer component comprises an input component that receives the multiple data streams in parallel.

3. The system of claim 1, wherein first data of the first data stream received by a first input sub-component is transferred by the first input sub-component to a first switch in response to the third clock signal associated with the first input sub-component being at a first level, wherein second data of the second data stream received by a second input sub-component is transferred by the second input sub-component to a second switch in response to the first clock signal associated with the second input sub-component being at the first level, wherein third data of the third data stream received by a third input sub-component is transferred by the third input sub-component to a third switch in response to the first clock signal associated with the third input sub-component being at the first level, and wherein fourth data of the fourth data stream received by a fourth input sub-component is transferred by the fourth input sub-component to a fourth switch in response to the third clock signal associated with the fourth input sub-component being at the first level.

4. The system of claim 1, wherein a buffer component is associated with a first data path and a second data path, wherein another buffer component is associated with a third data path and a fourth data path, wherein the switch is associated with the buffer component, and wherein the other switch is associated with the other buffer component.

5. The system of claim 4, wherein first data of the first data stream received by a first switch associated with the first data path is transferred by the first switch to the switch in response to the first clock signal associated with the first switch being at a first level, and wherein the switch transfers the first data to an output buffer to facilitate the generation of the serialized data stream in response to the first time-delayed clock signal associated with the switch being at the first level.

6. The system of claim 4, wherein second data of the second data stream received by a second switch associated with the second data path is transferred by the second switch to the switch in response to the third clock signal associated with the second switch being at the first level, and wherein the switch transfers the second data to an output buffer to facilitate the generation of the serialized data stream in response to the first time-delayed clock signal associated with the switch being at the first level.

7. The system of claim 4, wherein third data of the third data stream received by a third switch associated with the third data path is transferred by the third switch to the other switch in response to the third clock signal associated with the third switch being at the first level, and wherein the other switch transfers the third data to an output buffer to facilitate the generation of the serialized data stream in response to the second time-delayed clock signal associated with the other switch being at the first level.

8. The system of claim 4, wherein fourth data of the fourth data stream received by a fourth switch associated with the fourth data path is transferred by the fourth switch to the other switch in response to the first clock signal associated with the fourth switch being at the first level, and wherein the other switch transfers the fourth data to an output buffer to facilitate the generation of the serialized data stream in response to the second time-delayed clock signal associated with the other switch being at the first level.

9. The system of claim 1, wherein the first clock signal has a first time cycle, the second clock signal has a second time cycle that begins a quarter of a time cycle after a beginning of the first time cycle, the third clock signal has a third time cycle that begins a half of the time cycle after the beginning of the first time cycle, and the fourth clock signal has a fourth time cycle that begins a three-quarter of the time cycle after the beginning of the first time cycle.

10. The system of claim 1, wherein the serializer component is associated with a device, wherein the device comprises a transceiver, a transmitter, a digital-to-analog converter, a router, or a modem.

11. A data transmitting method, comprising:
    converting multiple data streams to a serialized data stream based at least in part on quadrature clock signals comprising a first clock signal, a second clock signal, a third clock signal, and a fourth clock signal, the multiple data streams comprising a first data stream, a second data stream, a third data stream, and a fourth data stream;
    generating a first matching delay clock signal based at least in part on the second clock signal, the first matching delay clock signal being provided to a switch associated with the first data stream and the second data stream to facilitate controlling switching of the switch to facilitate the converting; and generating a second matching delay clock signal based at least in part on the fourth clock signal, the second matching delay clock signal being provided to another switch associated with the third data stream and the fourth data stream to facilitate the controlling of the switching of the other switch to facilitate the converting.

12. The method of claim 11, further comprising:
receiving the multiple data streams simultaneously.

13. The method of claim 11, further comprising:
transferring first data of the first data stream to a first switch in response to the third clock signal being at a defined level;
transferring second data of the second data stream to a second switch in response to the first clock signal being at the defined level;
transferring third data of the third data stream to a third switch in response to the first clock signal being at the defined level; and
transferring fourth data of the fourth data stream to a fourth switch in response to the third clock signal being at the defined level.

14. The method of claim 13, further comprising:
in response to the first clock signal associated with the first switch being at the defined level, switching the first switch to an open state to enable the first data received by the first switch to be transferred to the switch; and
in response to the first matching delay clock signal associated with the switch being at the defined level, switching the switch to the open state to enable the first data received by the switch to be transferred to an output buffer to facilitate generating the serialized data stream.

15. The method of claim 13, further comprising:
in response to the third clock signal associated with the second switch being at the defined level, switching the second switch to an open state to enable the second data received by the second switch to be transferred to the switch; and
in response to the first matching delay clock signal associated with the switch being at the defined level, switching the switch to the open state to enable the second data received by the switch to be transferred to an output buffer to facilitate generating the serialized data stream.

16. The method of claim 13, further comprising:
in response to the third clock signal associated with the third switch being at the defined level, switching the third switch to an open state to enable the third data received by the third switch to be transferred to the other switch; and
in response to the second matching delay clock signal associated with the other switch being at the defined level, switching the other switch to the open state to enable the third data received by the other switch to be transferred to an output buffer to facilitate generating the serialized data stream.

17. The method of claim 13, further comprising:
in response to the first clock signal associated with the fourth switch being at the defined level, switching the fourth switch to an open state to enable the fourth data received by the fourth switch to be transferred to the other switch; and
in response to the second matching delay clock signal associated with the other switch being at the defined level, switching the other switch to the open state to enable the fourth data received by the other switch to be transferred to an output buffer to facilitate generating the serialized data stream.

18. The method of claim 14, wherein the first clock signal has a first time cycle that begins at a defined time, the second clock signal has a second time cycle that begins a quarter of the first time cycle after the defined time, the third clock signal has a third time cycle that begins a half of the first time cycle after the defined time, and the fourth clock signal has a fourth time cycle that begins a three-quarter of the first time cycle after the defined time.

19. A data transmitting device, comprising:
a serializer component that is configured to convert multiple data streams to a single serialized data stream based at least in part on quadrature clock signals comprising a first clock signal, a second clock signal, a third clock signal, and a fourth clock signal, wherein the multiple data streams comprise a first data stream, a second data stream, a third data stream, and a fourth data stream;
a set of register components comprising a first register component, a second register component, a third register component, and a fourth register component, wherein the set of register components receive the multiple data streams, wherein the first register component transfers first data of the first data stream and the fourth register component transfers fourth data of the fourth data stream based at least in part on the third clock signal, and wherein the second register component transfers second data of the second data stream and the third register component transfers third data of the third data stream based at least in part on the first clock signal;
a set of switch components comprising a first switch component, a second switch component, a third switch component, a fourth switch component, a fifth switch component, and a sixth switch component, wherein the first switch component transfers the first data and the fourth switch component transfers the fourth data based at least in part on the first clock signal, and wherein the second switch component transfers the second data and the third switch component transfers the third data based at least in part on the third clock signal; and
a time delay component that generates a first matching delay clock signal based at least in part on the second clock signal, and generates a second matching delay clock signal based at least in part on the fourth clock signal, wherein the time delay component provides the first matching delay clock signal to the fifth switch component associated with the first data stream and the second data stream to facilitate control of switching of the fifth switch component, and provides the second matching delay clock signal to a sixth switch component associated with the third data stream and the fourth data stream to facilitate control of switching of the sixth switch component.

20. The device of claim 19, wherein the device comprises a transceiver, a transmitter, a digital-to-analog converter, a router, or a modem.

* * * * *